(12) United States Patent
Yamada

(10) Patent No.: US 12,471,217 B2
(45) Date of Patent: Nov. 11, 2025

(54) SYSTEMS AND METHODS OF FABRICATING COILS FOR CORELESS TRANSFORMERS AND INDUCTORS

(71) Applicant: Nano Dimension Technologies LTD., Nes Ziona (IL)

(72) Inventor: Minoru Yamada, Kowloon (HK)

(73) Assignee: NANO DIMENSION TECHNOLOGIES, LTD., Ness Ziona (IL)

( * ) Notice: Subject to any disclaimer, the term of this patent is extended or adjusted under 35 U.S.C. 154(b) by 576 days.

(21) Appl. No.: 17/735,952

(22) Filed: May 3, 2022

(65) Prior Publication Data

US 2022/0272843 A1   Aug. 25, 2022

Related U.S. Application Data

(63) Continuation-in-part of application No. 17/608,239, filed as application No. PCT/US2020/031274 on May 4, 2020, now Pat. No. 11,694,837.

(Continued)

(51) Int. Cl.
*H05K 1/16* (2006.01)
*H01F 27/28* (2006.01)
(Continued)

(52) U.S. Cl.
CPC ......... *H05K 1/165* (2013.01); *H01F 27/2804* (2013.01); *H05K 3/0005* (2013.01); *H05K 3/125* (2013.01); *H05K 2201/086* (2013.01)

(58) Field of Classification Search
CPC ...... H05K 1/165; H05K 3/0005; H05K 3/125; H05K 2201/086; H05K 2201/09836;
(Continued)

(56) References Cited

U.S. PATENT DOCUMENTS 3,588,687 A * 6/1971 Kohler ................. H01F 29/12
336/225
3,815,069 A * 6/1974 Palazzetti ............. H01F 41/041
336/200

(Continued)

FOREIGN PATENT DOCUMENTS

CN   1363940   8/2002
CN   1770335   5/2006
(Continued)

OTHER PUBLICATIONS

Translation of DE-19844738-C1 (Year: 2000).*
(Continued)

*Primary Examiner* — Jeffrey T Carley
(74) *Attorney, Agent, or Firm* — PEARL COHEN ZEDEK LATZER BARATZ LLP

(57) ABSTRACT

The disclosure relates to systems and methods for fabricating printed circuit board (PCB) based transformers and/or coreless PCB-based circuits containing one or more coil inductor(s). More specifically, the disclosure is directed to systems and methods for fabricating PCB-based transformers and/or inductors having concentric or eccentric (non-concentric) continuous or concatenated coil architecture.

6 Claims, 11 Drawing Sheets

Related U.S. Application Data

(60) Provisional application No. 62/842,139, filed on May 2, 2019.

(51) Int. Cl.
  *H05K 3/00* (2006.01)
  *H05K 3/12* (2006.01)

(58) Field of Classification Search
  CPC .............. H01F 27/2804; H01F 41/043; H01F 2017/004; H01F 2017/0073; H01F 17/0013
  See application file for complete search history.

(56) References Cited

U.S. PATENT DOCUMENTS

| | | | |
|---|---|---|---|
| 5,312,674 A | 5/1994 | Haertling et al. | |
| 6,803,848 B2* | 10/2004 | Yeo | H10D 1/20 336/200 |
| 7,768,371 B2* | 8/2010 | Hui | H05K 1/165 336/200 |
| 8,072,773 B2* | 12/2011 | Mruz | H01F 27/06 345/161 |
| 8,299,652 B2* | 10/2012 | Sample | H04B 5/26 320/108 |
| 9,640,970 B2* | 5/2017 | Fluhrer | H01Q 1/50 |
| 9,681,549 B2* | 6/2017 | Chen | H01F 5/00 |
| 9,991,222 B2 | 6/2018 | Chen | |
| 10,115,510 B2* | 10/2018 | Keller | H01F 5/02 |
| 10,347,976 B2* | 7/2019 | Ziegler | H01P 3/08 |
| 10,905,017 B2 | 1/2021 | Shabtai et al. | |
| 10,980,136 B2 | 4/2021 | Mohr et al. | |
| 2002/0145500 A1* | 10/2002 | Razzell | H01F 27/2804 336/232 |
| 2005/0093670 A1* | 5/2005 | Neumann | H01F 27/292 336/208 |
| 2005/0156699 A1 | 7/2005 | Hui et al. | |
| 2006/0139124 A1* | 6/2006 | Fojas | H01P 5/02 333/185 |
| 2006/0158478 A1 | 7/2006 | Howarth et al. | |
| 2007/0094863 A1* | 5/2007 | Ogawa | H01F 17/045 29/605 |
| 2007/0164843 A1* | 7/2007 | Yagisawa | H01Q 19/09 336/83 |
| 2008/0042785 A1* | 2/2008 | Yagisawa | H01P 1/2007 333/245 |
| 2008/0231402 A1* | 9/2008 | Jow | H01F 17/0013 336/200 |
| 2010/0265023 A1 | 10/2010 | Bertilsson | |
| 2013/0199027 A1* | 8/2013 | Singh | H01R 43/20 29/602.1 |
| 2013/0201589 A1* | 8/2013 | Singh | H04B 5/77 361/139 |
| 2015/0197062 A1 | 7/2015 | Shinar et al. | |
| 2015/0201499 A1 | 7/2015 | Shinar et al. | |
| 2015/0201500 A1 | 7/2015 | Shinar et al. | |
| 2017/0023615 A1 | 1/2017 | Cetin | |
| 2017/0125165 A1 | 5/2017 | Prest | |
| 2017/0133152 A1 | 5/2017 | Masahiko et al. | |
| 2019/0115129 A1 | 4/2019 | Kim et al. | |

FOREIGN PATENT DOCUMENTS

| | | | |
|---|---|---|---|
| CN | 205945251 | 2/2017 | |
| CN | 106537532 | 3/2017 | |
| CN | 109156076 | 1/2019 | |
| DE | 19844738 C1 * | 5/2000 | ............. H01F 5/00 |
| EP | 0581206 | 2/1994 | |
| EP | 1221753 | 7/2002 | |
| JP | S62-257709 A | 11/1987 | |
| JP | 2012-160604 | 8/2012 | |
| KR | 20210000316 A * | 1/2021 | |
| WO | WO-2004073039 A2 * | 8/2004 | ............. H01F 17/02 |
| WO | WO 2017/172642 | 10/2017 | |
| WO | WO 2018/031186 | 2/2018 | |
| WO | WO 2018/140517 | 8/2018 | |
| WO | WO-2020255889 A1 * | 12/2020 | ........... H01F 27/292 |

OTHER PUBLICATIONS

Translation of KR 20210000316 A (Year: 2021).*
Translation of WO-2020255889-A1 (Year: 2020).*
Taeil Kim et al. "3D Printed Flexible Coreless Transformers"; 2018 International Flexible Electronics Technology Conference (IFETC); IEEE, Aug. 7, 2018.

* cited by examiner

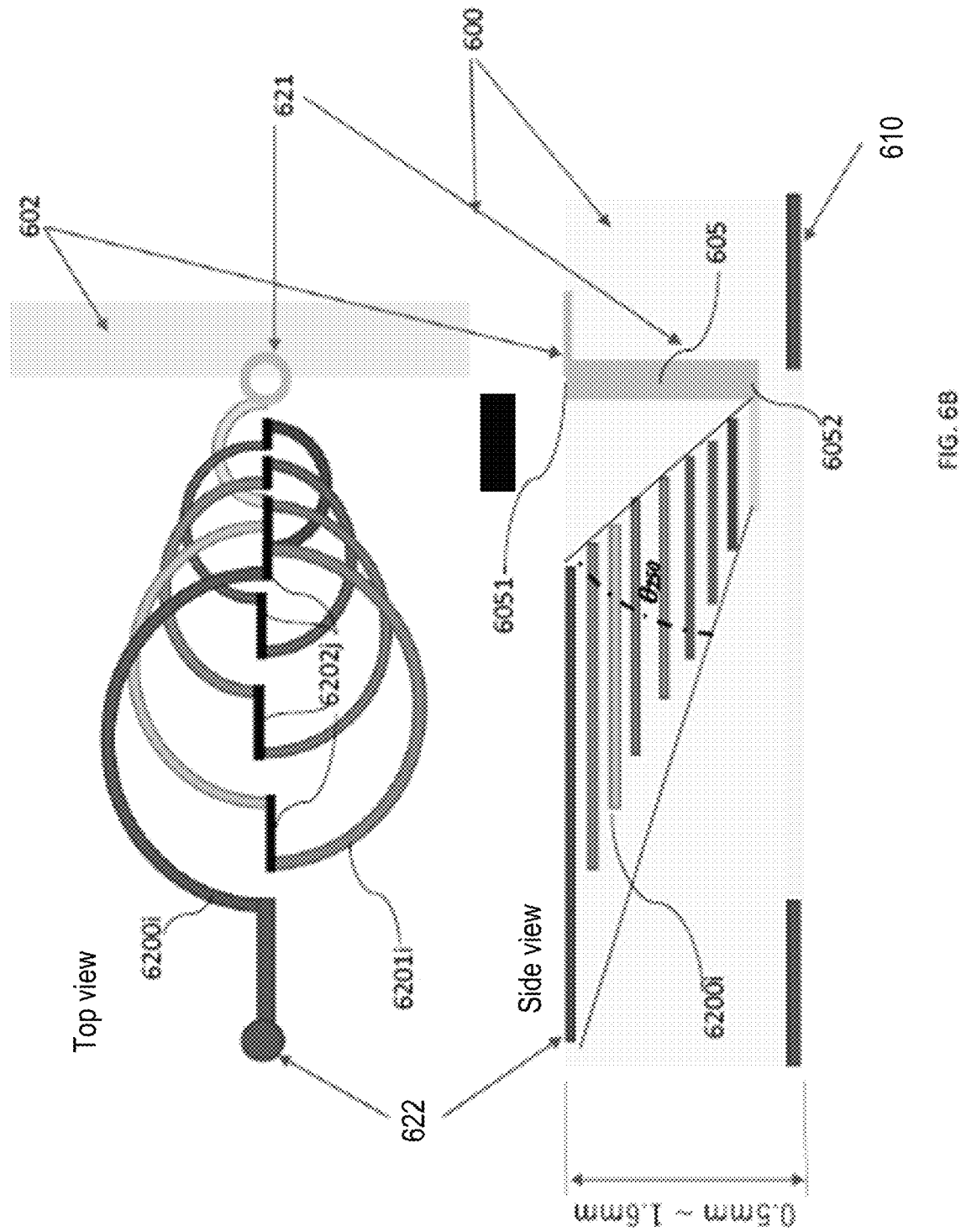

FIG. 7B    See e.g., FIG. 9A

Angle of tilt

SYSTEMS AND METHODS OF FABRICATING COILS FOR CORELESS TRANSFORMERS AND INDUCTORS

BACKGROUND

This patent application is a continuation-in-part of commonly owned and pending U.S. National Phase application Ser. No. 17/608,239 filed Nov. 2, 2021, which is the filing of now expired PCT Application No. PCT/US20/31274, filed May 4, 2020, which is based on and claims the benefit of the filing date of now expired U.S. Provisional Patent Application Ser. No. 62/842,139, filed May 2, 2019, all which are incorporated herein by reference in their entirely.

BACKGROUND

The disclosure is directed to systems and methods for fabricating Additively Manufactured Electronic (AME) circuit based transformers, transmitters and receivers. More specifically, the disclosure is directed to systems and methods for fabricating AME circuit-based inductors having eccentric winding element(s) configured to provide step-up/down data and/or energy conservation and conversion, or for temporary energy storage in a magnetic field.

Increasing demands is placed these days for high frequency magnetics that are substantially free of leakage inductance, skin and proximity effects as well as unbalanced magnetic flux distribution, all which are likely to generate localized hot spots and reduce the coupling coefficient.

For example, the "front end," of RF radio receiver/transmitter, which serves to receive RF signals and down-convert them to intermediate frequency (IF) signals. The radio receiver/transmitter front end may include a bias "T", a bandpass filter, an amplifier, and a mixer. A received RF signal passes through the bias "T" to isolate it from a DC signal coupled from a DC power supply. The received signal is then provided to a bandpass filter that rejects adjacent extraneous frequencies outside the bandwidth of the received signal. More particularly, the bias "T" provides selective electrical isolation of a DC power supply node from RF signals present in the circuit, allowing DC currents to flow with little or no restriction while impeding the flow of RF currents.

However, if the input data signal frequency, such as more than 10 GHz, is used, it is necessary to use special type of inductor coil for bias-T circuit or several inductors need to be connected to make a series circuit that can accommodate the high frequency data.

There are several factors influencing the value of the short circuit inductance in transformers and/or inductors; apart from the winding strategy, the construction technology, the separation between primary and secondary winding elements of transformers, plus the shape and dimension of the turns are all instrumental in achieving open circuit inductance values that exceed the values obtained with typical PCB-based circular-winding transformers (cored or coreless), which are typically in the range of nH and up to a few µH.

The present disclosure is directed toward overcoming one or more of the above-identified shortcomings by the use of additive manufacturing technologies and systems.

SUMMARY

Disclosed, in various exemplary implementations, are additive manufacturing methods for fabricating PCB-based transformers and/or inductor circuits having eccentric helical winding architecture.

In an exemplary implementation, provided herein is a printed circuit board (PCB) comprising an eccentric conical winding element having a feeding end, and a termination end, wherein the eccentric conical winding element comprises a plurality of non-concentric tear-drop shaped helical windings of increasing turn ratio, or decreasing turn ratio, from the bias feeding end to the termination end.

In another exemplary implementation, provided herein is a bias-T circuit board (BTCB) having a leg and a cross-bar comprising: an input port disposed at a first lateral end of the cross bar; a signal transmission line disposed along the cross-bar; at least one capacitor interposed between the input port and the transmission line; an output port disposed at a second lateral end of the cross bar; and an eccentric conical winding element having a bias feeding end, and a termination end coupled to the signal transmission line, wherein the eccentric conical winding element comprises a plurality of non-concentric tear-drop shaped helical windings of increasing turn ratio, or decreasing turn ratio, from the bias feeding end to the termination end.

In yet another exemplary implementation provided herein is a method of fabricating a printed circuit board comprising an eccentric conical winding element having a bias feeding end, and a termination end, wherein the eccentric conical winding element comprises a plurality of non-concentric tear-drop shaped helical windings of increasing turn ratio, or decreasing turn ratio, from the bias feeding end to the termination end, the method comprising: providing an ink jet printing system having: a first print head adapted to dispense a dielectric ink; a second print head adapted to dispense a conductive ink; a conveyor, operably coupled to the first and second print heads, configured to convey a substrate to each print heads; and a computer aided manufacturing ("CAM") module, in communication with each of the first, and second print heads, the CAM further comprising a central processing module (CPM) including at least one processor, in communication with a non-transitory computer readable storage device operable to store executable instructions that, when executed by the at least one processor cause the CAM to control the ink-jet printing system, by carrying out steps that comprise: receiving a 3D visualization file representing the eccentric conical winding element having a bias feeding end, and a termination end, wherein the eccentric conical winding element comprises a plurality of non-concentric tear-drop shaped helical windings of increasing turn ratio, or decreasing turn ratio, from the bias feeding end to the termination end; and generating a file library having a plurality of ordered files, each ordered file representing a substantially 2D layer for printing the eccentric conical winding element, the substantially 2D layer having thereon: at least one of: a conductive pattern; and a dielectric pattern; and a metafile representing at least the printing order; providing the dielectric inkjet ink composition, and the conductive inkjet ink composition; using the CAM module, obtaining a first ordered layer file for printing; using the first print head, forming the pattern corresponding to the dielectric inkjet ink of the first ordered layer file on the substrate; using actinic radiation, curing the dielectric pattern; using the second print head, forming the conductive pattern in the first ordered file for printing of the eccentric conical winding element; using heat, sintering the pattern corresponding to the conductive inkjet ink in the first ordered layer file, wherein the steps of curing and sintering are carried out separately; using the CAM module, obtaining from the library an ordered layer file representative of a subsequent layer for printing the eccentric conical winding element; using the first print head, forming the pattern corresponding to the dielectric ink in the subsequent ordered layer file; using actinic radiation, curing the dielectric pattern in the subsequent ordered layer file; using the second print head, forming the conductive pattern in the subsequent ordered layer file for printing of eccentric conical winding element; using heat, sintering the conductive pattern in the subsequent ordered layer file; repeating the steps of, obtaining from the library an ordered layer file representative of a subsequent layer for printing the eccentric conical winding element—to the step of sintering the conductive pattern in the subsequent ordered layer file, wherein upon printing the final layer, forming the eccentric conical winding element, with the plurality of non-concentric tear-drop shaped helical windings of increasing turn ratio, or decreasing turn ratio, from the bias feeding end to the termination end.

In even yet another exemplary implementation provided herein is a method for fabricating a bias-T circuit board (BTCB) having a leg and a cross-bar formed using the methods disclosed herein.

These and other features of the printed circuit boards, BTCB, and methods for fabricating eccentric conical tear-shaped winding element, will become apparent from the following detailed description when read in conjunction with the figures and examples, which are exemplary, not limiting.

BRIEF DESCRIPTION OF THE FIGURES

For a better understanding of the direct or indirect additive manufacturing methods and systems for printing of PCB-based for fabricating eccentric conical tear-shaped winding elements configured to received high-frequency RF signal and isolate it from a DC signal input from a DC power supply, with regard to the exemplary implementations thereof, reference is made to the accompanying examples and figures, in which:

FIG. 3A, illustrates a schematic top view of an exemplary implementation of cPCB-based transformer fabricated using the disclosed systems and methods described, which is depicted in FIG. 4A, while

FIG. 6B provides a top view and a side view of an exemplary implementation of the eccentric conical tear-shaped winding element;

DETAILED DESCRIPTION

Provided herein are implementations, examples and configurations of systems and methods for fabricating coreless PCB-based transformers and inductor-containing circuits, having helical winding element.

Figure 5B:
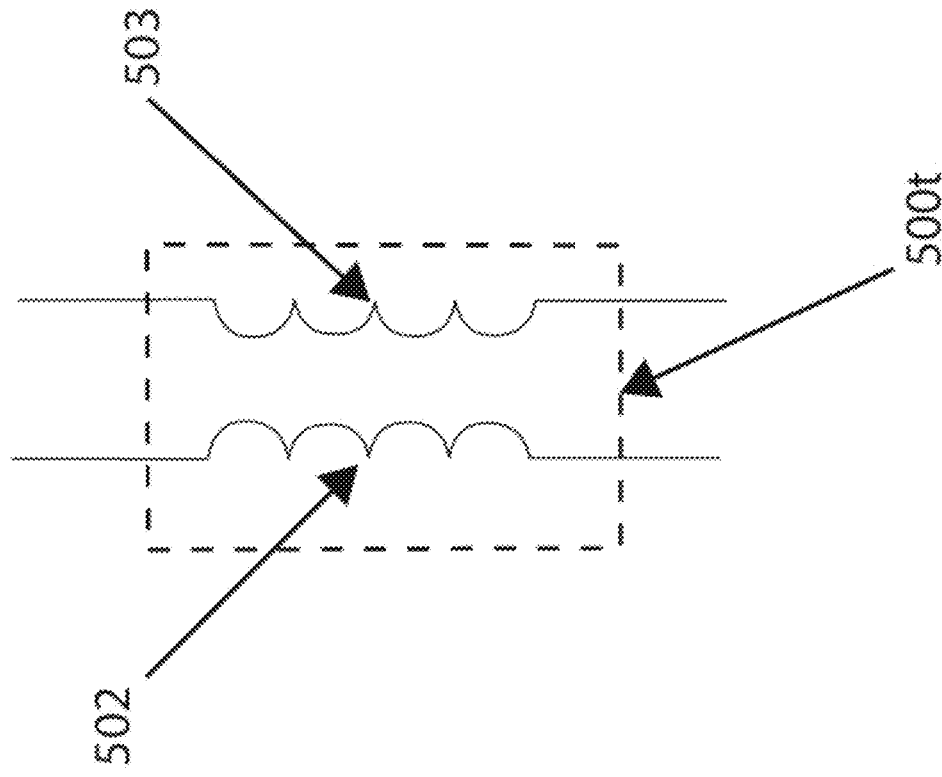
FIG. 5A, illustrates a single inductor winding, with transformer windings illustrated in FIG. 5B.
Figure 5A:
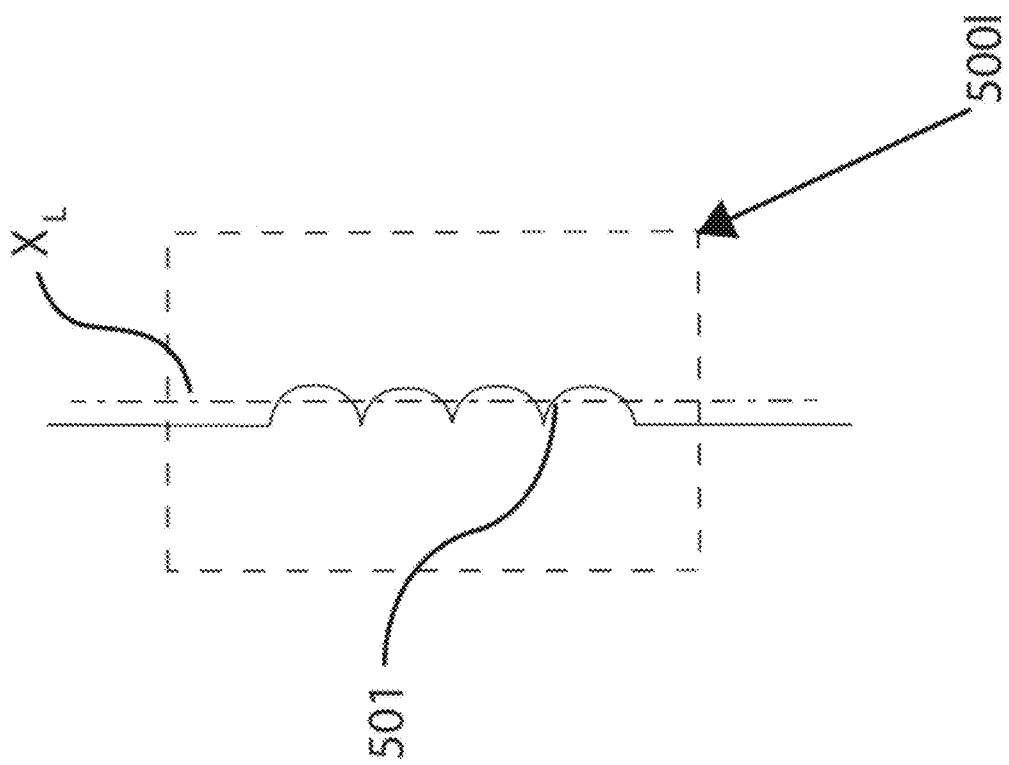

Specifically, in certain implementations, the cPCB-based transformers disclosed herein, having primary-secondary-secondary-primary (PSSP) structure, in order to ensure a better coupling between the primary and secondary winding elements. The cPCB-based transformer coil (or inductor coil (see e.g., FIG. 5A, 5B) is fabricated such that the winding(s) are in a helical form, having concatenated (linked) architecture, whereby an arc portion of predetermined radians are concatenated to the same or different arc portion with at least one of: a blind via, and a buried via, thus forming a concatenated helix having variable pitch and turn. The helical winding structure (of each winding element in the case of transformers), is configured to provide a higher value of inductance and lower resistance when compared to other structures such as planar hoop type, meander and closed type coils for given geometrical parameters, such as:

Number of turns (of primary (Np)/secondary(Ns))
Width of the conductor (W)
Height of the conductor (H)
Insulation layer Thickness (Z)
Track separation (S)
Inner/outermost radius (Ri/Ro)
Shape of the winding (Circular Spiral, tear-shape)

In an exemplary implementation, the primary and secondary winding helical elements for cPCBTs are fabricated to form a double helix such that the secondary helical winding element is nested concentrically (in other words, co-axial), within the primary helical winding element, where both have the same pitch but different turn, to provide a windings' turn ratio of the primary winding element to secondary winding element that is ≠1, thus being configured to provide step-up or step-down capabilities in the transfer of data/power.

In another exemplary implementation, the double helix is not translated along the common axis, although in certain circumstances and examples where induction is desirable without the step up/down transformation capabilities, the methods implemented in the systems disclosed herein can be used to fabricate the double helix winding elements with the translation along the longitudinal axis of the helix (spiral). As further illustrated, the double helix may not have the same turn ratio along the longitudinal axis of the helix, and form a cone. Furthermore, the windings may form a lobe having non-circular character but rather have a tear-shape (see e.g., FIGS. 9A, 9B). In the context of the disclosure, the term "tear shape" refers to winding shapes that are semi-circular, but which circumference terminate in a baseless triangle, or an ovoid portion.

As used herein, the term "pitch" in the context of the helix described, refers to the distance (e.g., in μm) in parallel with the helix' defined longitudinal axis ($X_L$, see e.g., FIG. 5A) needed to achieve a 360° (or full turn) turn of the conductive matter. Likewise, the term "turn" in the context of the helices described, refers to the length (e.g., in p.m) needed to obtain one full 360° or one full winding rotation of the helix around longitudinal axis $X_L$.

Figure 4A:
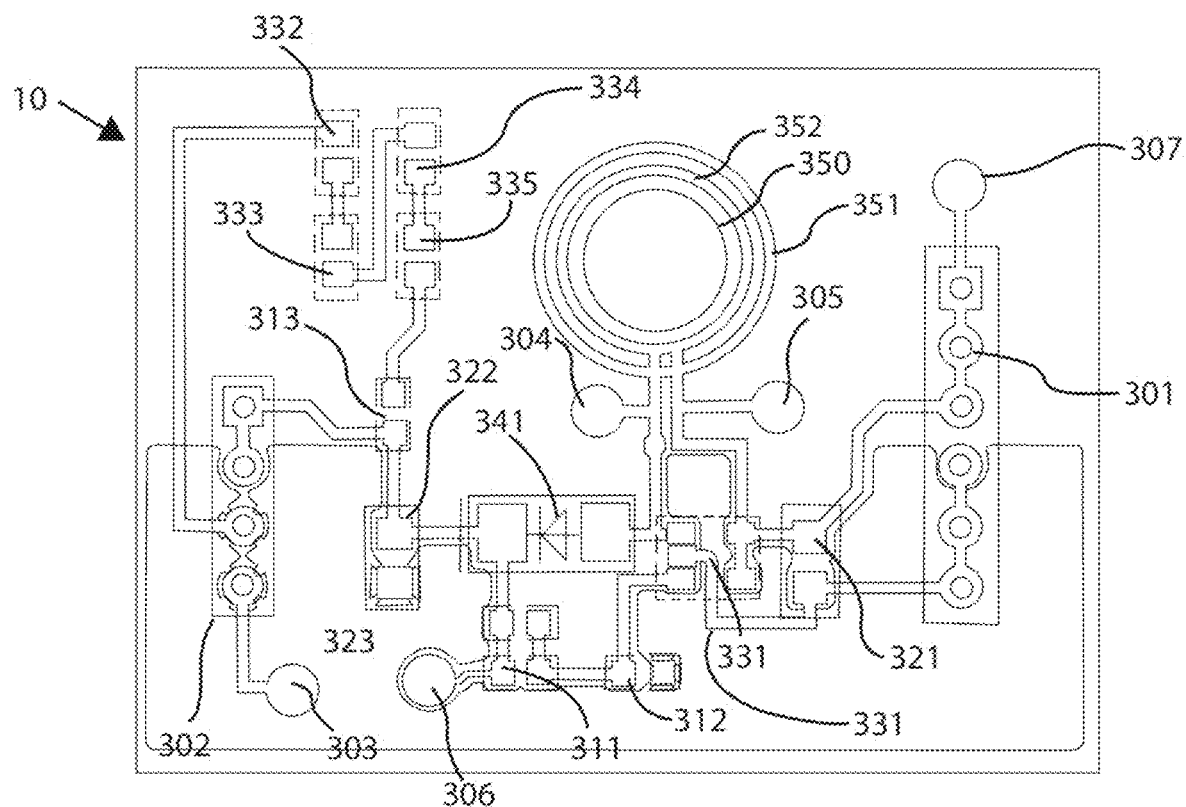
FIG. 4A, is a top view depicting the cPCB-based transformer of FIG. 3B having the lumped circuit model of FIG. 1.
Figure 4B:
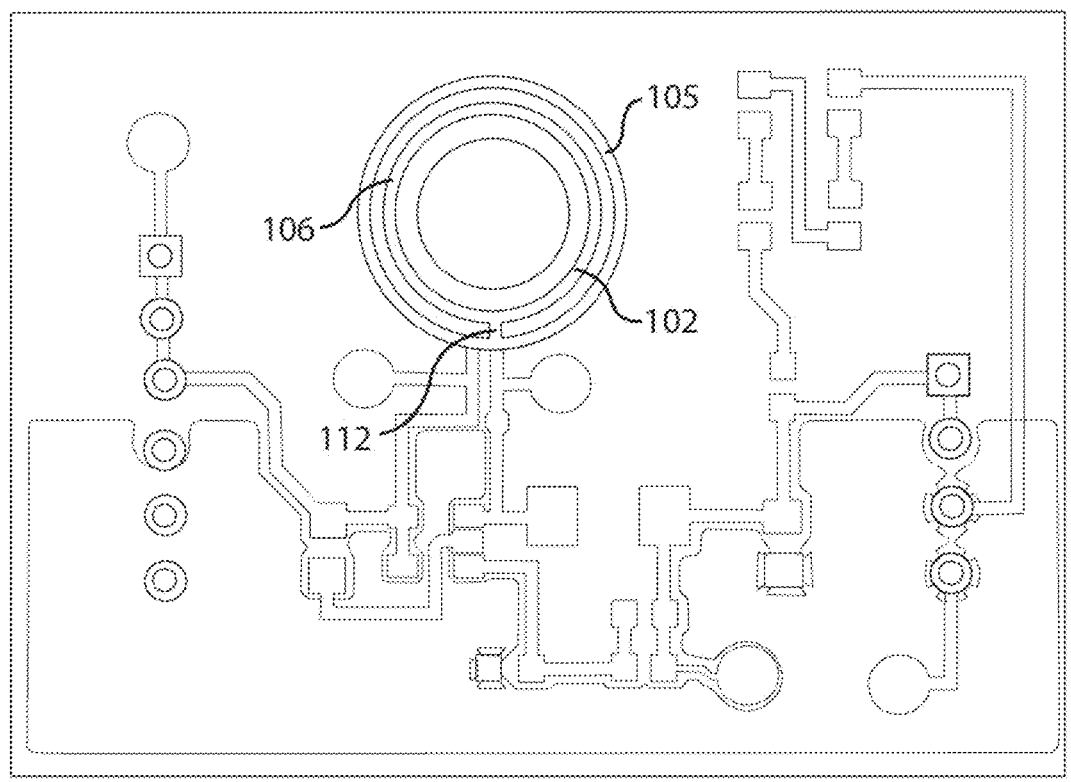
FIG. 4B is a bottom view depiction of the cPCB-based transformer of FIG. 3A.

The systems, methods and compositions described herein can be used to form/fabricate a PCB-based transformer and/or inductor coils, utilizing a combination of print heads with conductive and dielectric ink compositions in a single, continuous additive manufacturing process (pass), using for example, an inkjet printing device, or using several passes. Using the systems, methods and compositions described herein, a thermoset resin material can be used to form the insulating and/or dielectric portion of the printed boards (see e.g., 100 FIG. 4A, 600 FIG. 7B). This printed dielectric inkjet ink (DI) material is printed in optimized shape including accurate via locations (see e.g., FIG. 2, 104$_i$; FIG. 9B 6202*j*) plated through holes for core (less) location 350 (see e.g., bias supplier FIG. 4A, or 630, FIG. 7B), and input and output junctions 301, 302 (FIG. 4A, 4B), as well as 6021, 6022 (FIG. 7B) and illustrated in FIG. 9B (and FIG. 6B)

While reference is made to inkjet inks, other additive manufacturing methods (also known as rapid prototyping, rapid manufacturing, and 3D printing), are also contemplated in the implementation of the disclosed methods. In an exemplary exemplary implementation, the cPCB-based transformers/inductors described herein can likewise be fabricated by a selective laser sintering (SLS) process, direct metal laser sintering (DMLS), electron beam melting (EBM), selective heat sintering (SHS), or stereolithography (SLA). The cPCB-based transformers described herein, comprising for example a double helical winding loop, may be fabricated from any suitable additive manufacturing material, such as metal powder(s) (e.g., cobalt chrome, steels, aluminum, titanium and/or nickel alloys), gas atomized metal powder(s), thermoplastic powder(s) (e.g., polylactic acid (PLA), acrylonitrile butadiene styrene (ABS), and/or high-density polyethylene (HDPE)), photopolymer resin(s) (e.g., UV-curable photopolymers such as, for example PMMA), thermoset resin(s), thermoplastic resin(s), or any other suitable material that enables the functionality as described herein.

The systems used can typically comprise several sub-systems and modules. These can be, for example: additional conductive and dielectric print-heads, a mechanical sub-system to control the movement of the print heads, the chuck, its heating and conveyor motions; the ink composition injection systems; the curing (e.g., a UV radiation source)/sintering (e.g., a directional heating element, focused IR lamp and the like) sub-systems; a computerized sub-system with at least one processor or central processing unit, or module (CPU, CPM), or graphical processing unit (GPU) that is operable to control the process and generates the appropriate printing instructions, a component placement system (e.g., for an external resonant capacitor across the secondary winding element's terminals), such as automated robotic arm, a hot air knife for soldering, a machine vision system, and a command and control system to control the 3D printing.

Accordingly and in an exemplary implementation, provided herein is a method for fabricating a coreless printed circuit board (PCB)-based transformer (cPCBT) comprising at least one primary winding and at least one secondary winding elements, said cPCBT having a windings' turn ratio of the primary winding element to the secondary winding element operable to achieve a step-up/down-operation, the method comprising: providing a printing system having: a first print head adapted to dispense a dielectric ink; a second print head adapted to dispense a conductive ink; a conveyor, operably coupled to the first and second print heads, configured to convey a substrate to each print heads; and a computer aided manufacturing ("CAM") module in communication with the first print head, the second print heads, and the conveyor, the CAM module comprising: at least one processor; a non-volatile memory storing thereon a set of executable instructions, configured, when executed to cause the at least one processor to: receive a 3D visualization file representing the transformer; using the 3D visualization file, generate a library comprising a plurality of ordered layer files, each ordered layer file representing a substantially 2D layer for printing the cPCBT with a metafile defining at least the printing order of the ordered layer file; using the library, for each ordered layer file, generate a conductive ink pattern comprising the conductive portion of each of the ordered layer files for printing the conductive portion of the PCB transformer; using the library, and for the same ordered layer file comprising the conductive pattern—generate the ink pattern corresponding to the dielectric ink portion, wherein the CAM module is operable to control each of the first and the second print heads; providing the dielectric ink composition, and the conductive ink composition; using the CAM module, obtaining the first ordered layer file; using the first print head, forming (in other words, printing) the pattern corresponding to the dielectric ink; using actinic radiation, curing the pattern corresponding to the dielectric ink in the first ordered layer file; using the second print head, forming the pattern corresponding to the conductive ink in the first ordered layer file; and using heat, sintering the pattern corresponding to the conductive ink, wherein the steps of curing and sintering are carried out separately (in other words, sequentially but not simultaneously, using different sub-systems).

Likewise and in another exemplary implementation illustrated in FIGS. 3A-4B, provided herein is a method for fabricating a cPCB-based bias supplier for providing e.g., bias voltage, comprising a concatenated helical winding, the method comprising: providing a printing system having: a first print head adapted to dispense a dielectric ink; a second print head adapted to dispense a conductive ink; a conveyor, operably coupled to the first and second print heads, configured to convey a substrate to each of the first and second print heads; and a computer aided manufacturing ("CAM") module in communication with the first print head, the second print heads, and the conveyor, the CAM module comprising: at least one processor; a non-volatile memory storing thereon a processor readable media with a set of executable instructions, configured, when executed to cause the at least one processor to: receive a 3D visualization file representing the cPCB-based bias supplier; using the 3D visualization file, generate a library comprising a plurality of ordered layer files, each ordered layer file representing a substantially 2D layer for printing the cPCB-based bias supplier; using the library, for each ordered layer file, generate a conductive ink pattern comprising the conductive portion of the cPCB-based bias supplier; using the library, for each ordered layer file, generate the ink pattern corresponding to the dielectric ink portion for printing a dielectric portion of the cPCB-based bias supplier, the dielectric pattern and conductive pattern being on the same ordered layer file in the library, wherein the CAM module is configured to control each of the first and the second print heads, as well as the conveyor; providing the dielectric ink composition, and the conductive ink composition; using the CAM module, obtaining the first ordered layer file; using the first print head, forming the pattern corresponding to the dielectric ink of the cPCB-based bias supplier in the first ordered layer file; using actinic radiation, curing the pattern corresponding to the dielectric ink in the first ordered file for printing; using the second print head, forming the pattern corresponding to the conductive ink in the first ordered file for printing; and, using heat—sintering the pattern corresponding to the conductive ink, wherein the steps of curing and sintering are carried out separately.

Figure 6A:
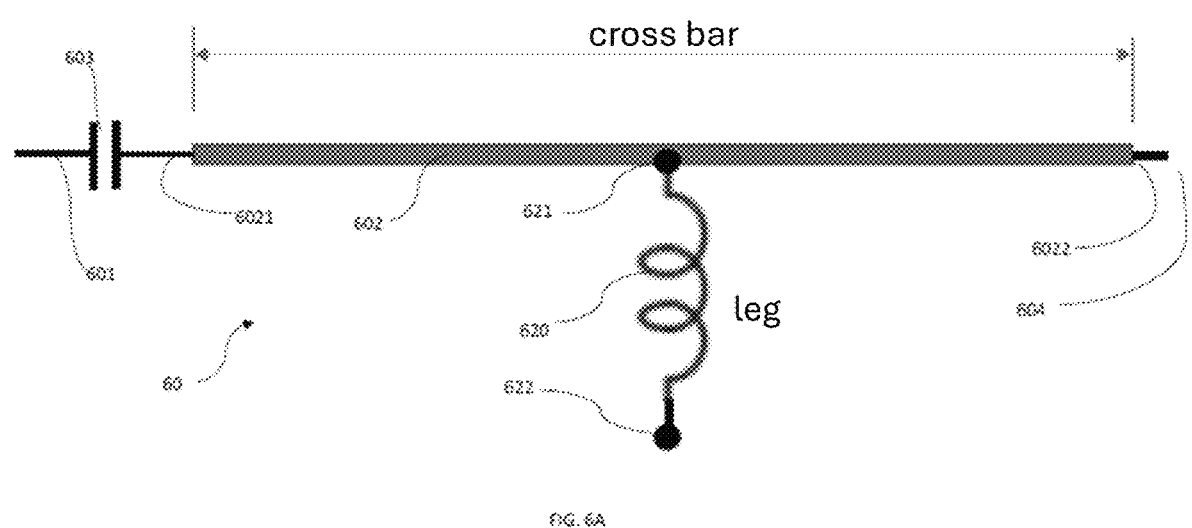
FIG. 6A is a schematic representation of the Bias-T printed circuit (BTCB) according to an exemplary implementation.
Figure 9A:
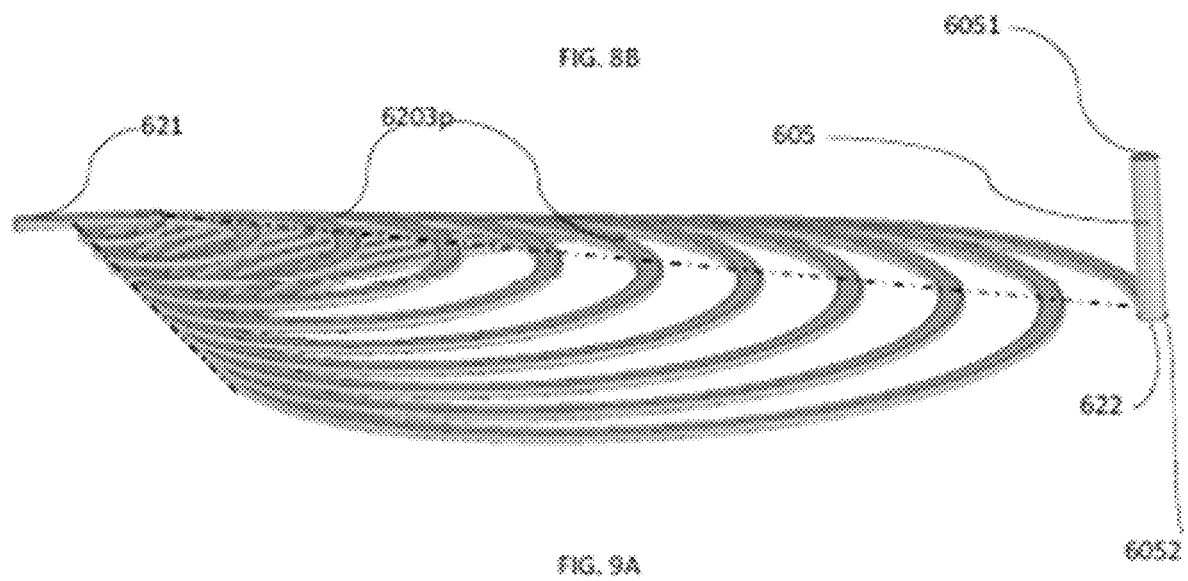
FIG. 9A, illustrates a schematic perspective of the second exemplary implementation of the eccentric conical tear-shaped winding element printed using the methods disclosed and used in FIG. 7B; with FIG. 9B, illustrating a schematic top planar view of the first exemplary implementation of the eccentric conical tear-shaped winding element printed using the methods disclosed and used in FIG. 7C.
Figure 10A:
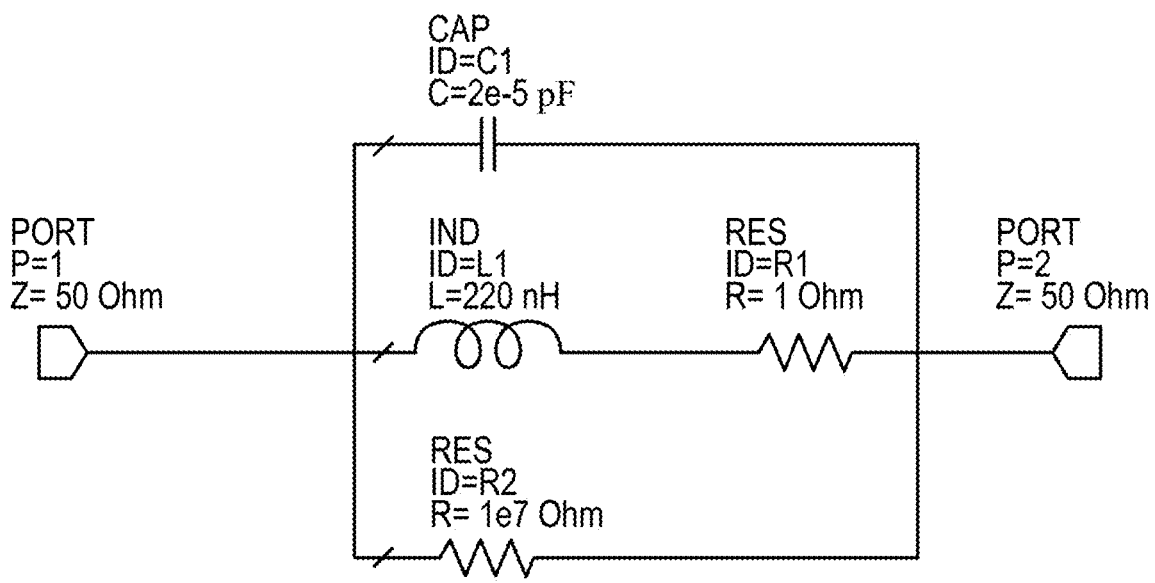
FIG. 10A, is an equivalent lumped circuit model for simulation of the eccentric conical tear-shaped winding element for measuring coil DCR at predetermined frequencies, with FIG. 10B, illustrating $S_{2,1}$ of the eccentric conical tear-shaped winding element at frequency of between 500 MHz, and 70 GHz.
Figure 10B:
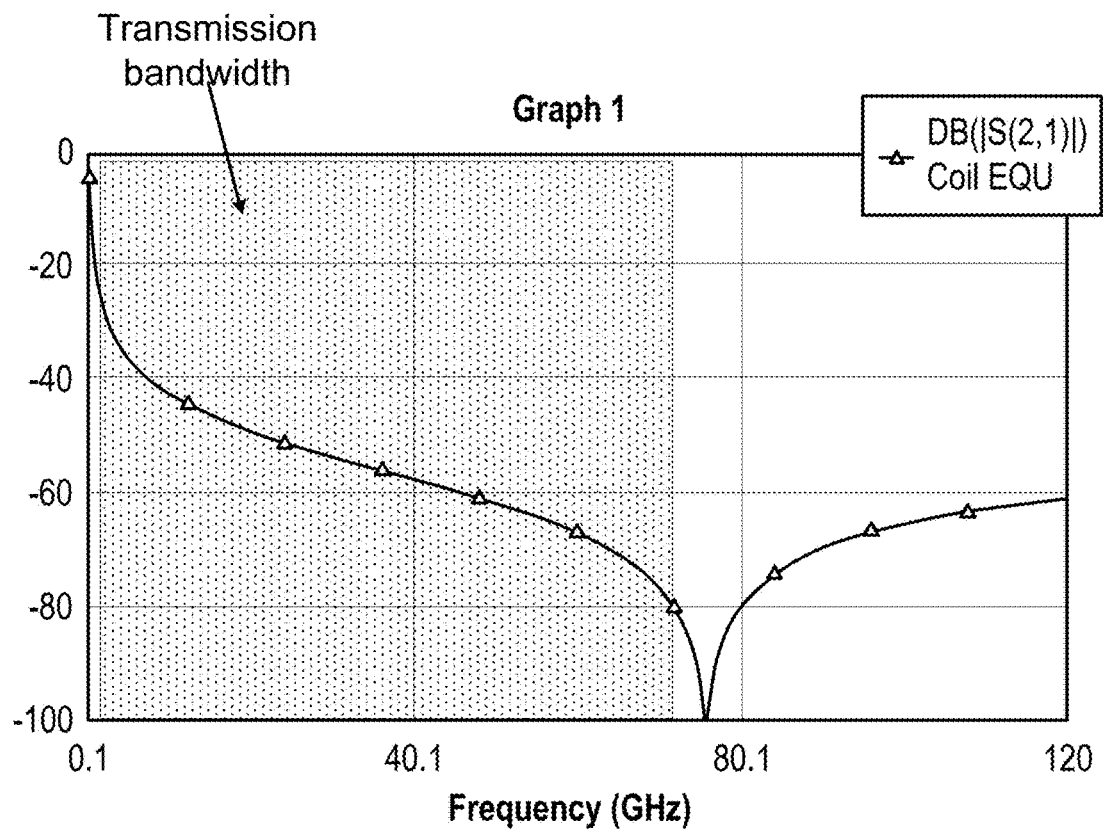
Figure 11A:
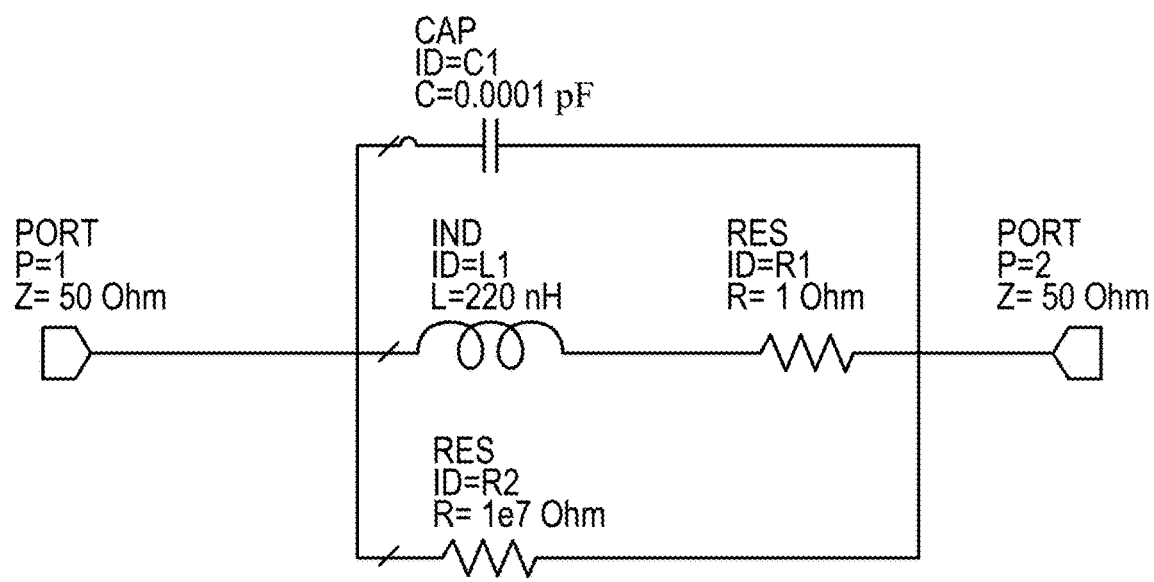
FIG. 11A is an equivalent lumped circuit model for simulation of the eccentric conical tear-shaped winding element for measuring coil DCR at predetermined frequencies, with FIG. 11B, illustrating $S_{2,1}$ of the eccentric conical tear-shaped winding element at frequency of between 500 MHz, and 30 GHz.
Figure 11B:
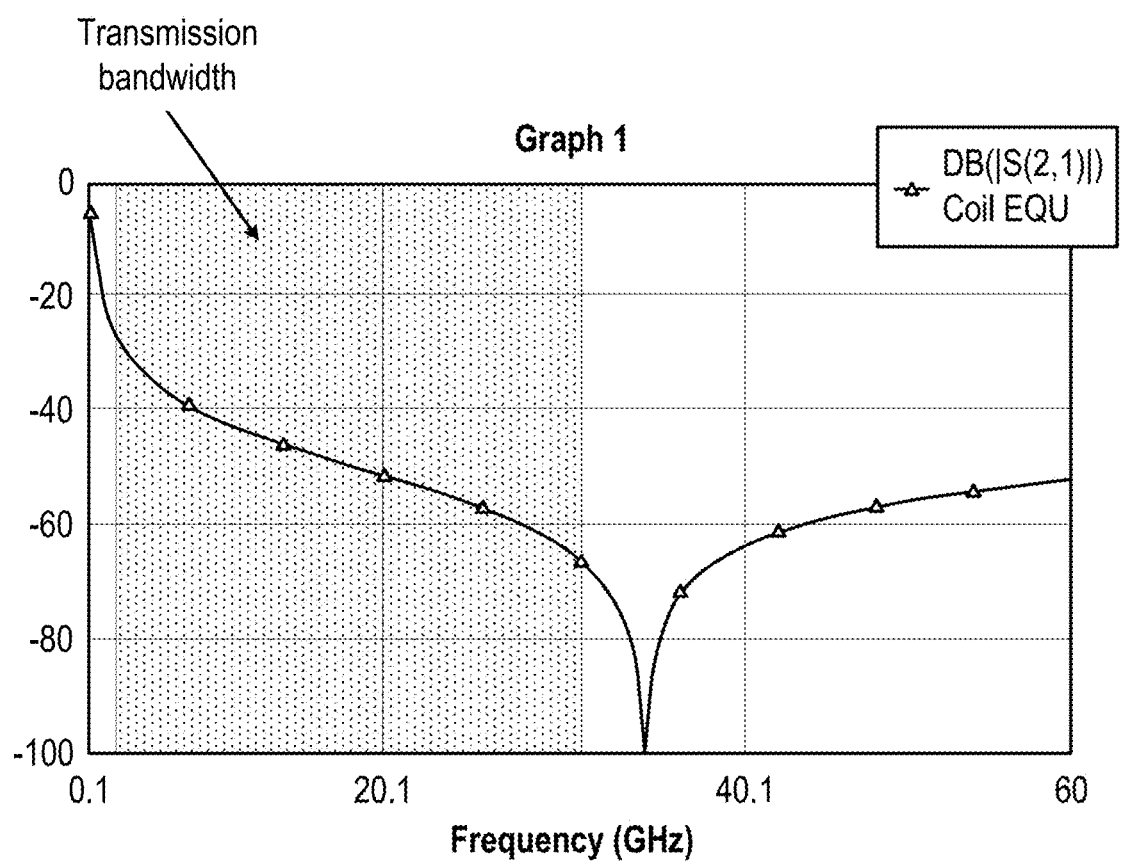

In an exemplary implementation, it was determined that creating eccentric conical winding element having a bias feeding end, and a termination end comprising a plurality of non-concentric tear-drop shaped helical windings of increasing turn ratio (see e.g., FIG. 9A), or decreasing turn ratio (see e.g., FIG. 6B), from the bias feeding end to the termination end is advantageous in processing high-frequency wave (e.g., between about 500 MHz and about 80 GHz), as evident form $S_{21}$, the forward gain insertion loss in a two-port Bias-T circuit (see e.g., FIGS. 6A, and 10B, 11B). Accordingly, provided herein is a Bias T circuit board (BTCB) having a leg and a cross-bar comprising: an input port disposed at a first lateral end of the cross bar; a signal transmission line disposed along the cross-bar; at least one capacitor interposed between the input port and the transmission line; an output port disposed at a second lateral end of the cross bar; and an eccentric conical winding element having a bias feeding end, and a termination end coupled to the signal transmission line, wherein the eccentric conical winding element comprises a plurality of non-concentric tear-drop shaped helical windings of increasing turn ratio, or decreasing turn ratio, from the bias feeding end to the termination end.

In an exemplary implementation, the eccentric conical winding element having a bias feeding end, operable to couple to a biasing element such as a DC power supply, and a termination end coupled to the signal transmission line, wherein the eccentric conical winding element comprises a plurality of non-concentric tear-drop shaped helical windings of increasing turn ratio, or decreasing turn ratio, from the bias feeding end to the termination end. In the context of the disclosure, the term "signal transmission line" means a dedicated conduit operable to transfer a signal in a contained manner from one location (e.g., input port") to another location (e.g., an integrated circuit). To reiterate, in certain exemplary implementations, RF signal received pass through the bias-T circuit board to isolate it from a DC signal from a DC power supply coupled to the bias feeding end (see e.g., 621 FIG. 7B).

Accordingly and in another exemplary implementation, provided herein is a method of fabricating a printed circuit board comprising an eccentric conical winding element having a bias feeding end, and a termination end, wherein the eccentric conical winding element comprises a plurality of non-concentric tear-drop shaped helical windings of increasing turn ratio, or decreasing turn ratio, from the bias feeding end to the termination end, the method comprising: providing an ink jet printing system having: a first print head adapted to dispense a dielectric ink; a second print head adapted to dispense a conductive ink; a conveyor, operably coupled to the first and second print heads, configured to convey a substrate to each print heads; and a computer aided manufacturing ("CAM") module, in communication with each of the first, and second print heads, the CAM further comprising a central processing module (CPM) including at least one processor, in communication with a non-transitory computer readable storage device operable to store executable instructions that, when executed by the at least one processor cause the CAM to control the ink-jet printing system, by carrying out steps that comprise: receiving a 3D visualization file representing the eccentric conical winding element having a bias feeding end, and a termination end, wherein the eccentric conical winding element comprises a plurality of non-concentric tear-drop shaped helical windings of increasing turn ratio, or decreasing turn ratio, from the bias feeding end to the termination end; and generating a file library having a plurality of ordered files, each ordered file representing a substantially 2D layer for printing the eccentric conical winding element, the substantially 2D layer having thereon: at least one of: a conductive pattern; and a dielectric pattern; and a metafile representing at least the printing order; providing the dielectric inkjet ink composition, and the conductive inkjet ink composition; using the CAM module, obtaining a first ordered layer file for printing; using the first print head, forming the pattern corresponding to the dielectric inkjet ink of the first ordered layer file on the substrate; using actinic radiation, curing the dielectric pattern; using the second print head, forming the conductive pattern in the first ordered file for printing of the eccentric conical winding element; using heat, sintering the pattern corresponding to the conductive inkjet ink in the first ordered layer file, wherein the steps of curing and sintering are carried out separately; using the CAM module, obtaining from the library an ordered layer file representative of a subsequent layer for printing the eccentric conical winding element; using the first print head, forming the pattern corresponding to the dielectric ink in the subsequent ordered layer file; using actinic radiation, curing the dielectric pattern in the subsequent ordered layer file; using the second print head, forming the conductive pattern in the subsequent ordered layer file for printing of eccentric conical winding element; using heat, sintering the conductive pattern in the subsequent ordered layer file; repeating the steps of, obtaining from the library an ordered layer file representative of a subsequent layer for printing the eccentric conical winding element—to the step of sintering the conductive pattern in the subsequent ordered layer file, wherein upon printing the final layer, forming the eccentric conical winding element, with the plurality of non-concentric tear-drop shaped helical windings of increasing turn ratio, or decreasing turn ratio, from the bias feeding end to the termination end.

In an exemplary implementation, upon printing the final layer, according to an exemplary implementation of the method for fabricating printed circuit board comprising an eccentric conical winding element; each of the plurality of non-concentric tear-drop shaped helical windings can be sized configured and adapted to comprise a plurality of planar sub-element arcs of predetermined curvature, each sub-element arc is concatenated to a subsequent sub-element arc with at least one of: a blind via, and a buried via. It is noted, that in certain exemplary implementations, the blind via, and/or the buried via, are plated or solid, and can be printed in an angle. Furthermore, in yet other exemplary implementations, upon printing the final layer, each of the plurality of non-concentric tear-drop shaped helical windings (whether a continuous helical element or a via-concatenated helical winding), can wind continuously at a predetermined pitch of between about 20 µm and about 1000 µm while maintaining the tear-shape configuration, whereby the turn ratio of the helical tear-shaped windings is between 1.1 and 40.

In an exemplary implementation, the primary and secondary helical winding elements are formed over at least 8 winding layers, and wherein at least one winding layer is an external winding layer of the eccentric (interchangeable with non-concentric) conical, tear-shaped winding element.

Unless specifically stated otherwise as apparent from the following discussions, it should appreciated that throughout the disclosure, discussions utilizing terms such as "accessing" or "placing" or "forming" or "mounting" or "removing" or "attaching" or "processing" or "performing" or "generating" or "adjusting" or "creating" or "executing" or "continuing" or "calculating" or "determining" or the like, refer to the action and processes of, or under the control of, a computer system, or similar electronic computing device, that manipulates and transforms data represented as physical (electronic) quantities within the computer system's registers, libraries, databases and memories into other data similarly represented as physical quantities within the computer system memories or registers or other such information storage, transmission or display devices. It should be noted however, that all of these and similar terms are to be associated with the appropriate physical quantities and are merely convenient labels applied to these actions and quantities.

Furthermore, the set of executable instructions are further configured, when executed to cause the processor to: using the 3D visualization file, generate a library of a plurality of subsequent layers' files each subsequent layers' file represents a substantially two dimensional (2D) subsequent layer for printing a subsequent portion of the cPCB transformer or inductor-containing circuit(s).

The CAM module can therefore comprise: an ordered 2D file library storing the files converted from the 3D visualization file of the cPBCT, or the cPCB-based bias supplier. The term "library, as used herein, refers to the collection of all 2D ordered layer files derived from the 3D visualization file, containing the information necessary to print each conductive and dielectric pattern, which is accessible and used by the data collection application, which can be executed by the computer-readable media. In the context of the disclosure, "ordered" layer file, refer to the substantially 2D layer file and their printing order, as specified for example in a metafile accessible by the at least one processor included in the CAM module.

The CAM module further comprises at least one processor in communication with the library; a non-volatile memory device storing a set of operational instructions for execution by the at least one processor; a micromechanical inkjet print head or heads in communication with the processor and with the library; and a print head (or, heads') interface circuit in communication with the 2D file library, the memory and the micromechanical inkjet print head or heads , the 2D file library configured to provide printer operation parameters specific to a functional layer.

The use of the term "module" does not imply that the components or functionality described or claimed as part of the module are all configured in a (single) common package. Indeed, any or all of the various components of a module, whether control logic or other components, can be combined in a single package or separately maintained and can further be distributed in multiple groupings or packages or across multiple (remote) locations and devices. Furthermore, in certain implementations, the term "module" refers to a monolithic or distributed hardware unit(s). Also, the term "dispense", in the context of the first print-head is used to designate the device from which the ink drops are dispensed. The dispenser can be, for example an apparatus for dispensing small quantities of liquid including micro-valves, piezoelectric dispensers, continuous-jet print-heads, boiling (bubble-jet) dispensers, and others—affecting the temperature and properties of the fluid flowing through the dispenser.

Accordingly and in an exemplary implementation, the methods implemented using the systems and compositions form/fabricate the cored or corelesss PCB-based transformers and PCB-based bias supplier described herein, having a windings' turn ratio of the primary winding element to the secondary winding element that is operable to achieve a step-up/down-operation, and or helical inductor coils, further comprises, following the step of using heat (e.g., with focused IR lamp, a shielded heat element and the like) sintering the pattern corresponding to the conductive ink: using the CAM module, accessing the library; obtaining a generated ordered layer file of a subsequent layer of the (coreless) PCB; and repeating the steps for forming the subsequent layer, wherein each of the primary winding element and each secondary winding element are arranged as at least one of: a planar winding, a stacked winding, and an interleaved winding.

Accordingly and in another exemplary implementation, provided herein is a method of fabricating at least one of: a cPCBT, with a windings' turn ratio of the primary winding element to the secondary winding element that is operable to achieve a step-up/down-operation, and or helical inductor coils, the method comprising: the method comprising: providing an ink jet printing system having: a first print head adapted to dispense a dielectric ink; a second print head adapted to dispense a conductive ink; a conveyor, operably coupled to the first and second print heads, configured to convey a substrate to each print heads; and a computer aided manufacturing ("CAM") module, in communication with each of the first, and second print heads, the CAM further comprising a central processing module (CPM) including at least one processor, in communication with a non-transitory computer readable storage device operable to store instructions that, when executed by the at least one processor cause the CAM to control the ink-jet printing system, by carrying out steps that comprise: receiving a 3D visualization file representing the cPCBT; and generating a file library having a plurality of ordered files, each ordered file representing a substantially 2D layer for printing the cPCBT having thereon at least one of: a conductive pattern, and a dielectric pattern, and a metafile representing at least the printing order; providing the dielectric inkjet ink composition, and the conductive inkjet ink composition; using the CAM module, obtaining a first ordered layer file for printing; using the first print head, forming the pattern corresponding to the dielectric inkjet ink of the first ordered file on the substrate; using actinic radiation, curing the dielectric pattern; using the second print head, forming the conductive pattern in the first ordered file for printing of cPCBT; using heat, sintering the pattern corresponding to the conductive inkjet ink; using the CAM module, obtaining from the library an ordered layer file representative of a subsequent layer for printing the cPCBT, the subsequent file comprising printing instructions for a pattern representative of at least one of: the dielectric ink, and the conductive ink; repeating the steps of: using the first print head, forming the pattern corresponding to the dielectric ink, to the step of using the CAM module, obtaining from the 2D file library the subsequent, substantially 2D layer, wherein upon printing the final layer, forming the cPCBT, with a windings' turn ratio of the primary winding element to the secondary winding element that is operable to achieve a step-up/down-operation, and or helical inductor coils, and wherein each of the primary winding element and the secondary winding element of the winding and/or the helical induction coil is comprised of a plurality of sub-element arcs of predetermined radians, each sub-element arc is configured to be planar in a consecutive winding layer, and is concatenated to a subsequent sub-element arc with at least one of a blind via, and a buried via.

The term "planar winding" transformer means, in this context, a transformer or inductor winding structure in which the windings have been implemented by using substantially planar conductive patterns; at least two of which are stacked upon one another so that there is an insulating layer between two successive conductive layers. Likewise, "stacked winding" in this context, refers to a structure in which the winding is implemented by stacking layers of (spiral) winding concentrically, one on top of the other throughout the PCB (see e.g., FIG. 9A). Also, the winding can be eccentric in nature, having a tear-shape drop, forming an oblique conical shape, whereby the longitudinal axis is tilted at an angle $\theta_{200}$ that is less than 90° (see e.g., FIG. 8B).

In certain implementation, the windings are continuous throughout the thickness of the PCB (see e.g., FIG. 9A), whereas, in other exemplary implementations (see e.g., FIG. 9B), each of the winding element of the winding and/or the helical induction coil is comprised of a plurality of sub-element arcs (6200i, 6201i) of predetermined dimension, each sub-element arc is configured to be planar in a consecutive winding layer, and is concatenated to a complementary sub-element arc with at least one of a blind via, and a buried via (6202j).

In an example, each of the primary winding element and each secondary winding element forming the windings of the cPCB-based transformer disclosed herein and/or the inductor coil (with a single winding element) are arranged as a helical winding in a plurality of winding layers, with a first winding layer being an apical winding layer a last winding layer being a basal winding layer, and whereby each winding layer is coupled to an adjacent (subsequent/preceding) winding layer by a via, for example, a buried via, or a blind via.

Figure 2:
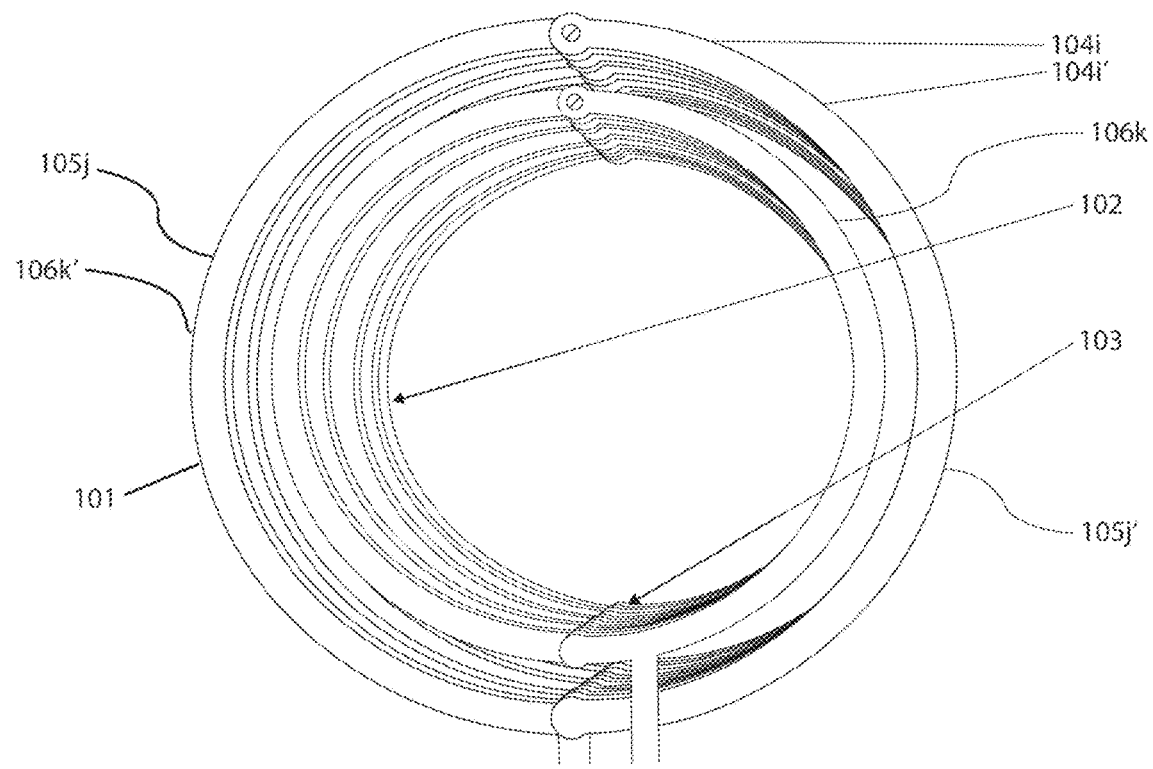
FIG. 2 is a top view of the stacked winding fabricated in FIG. 3.
Figure 3A:
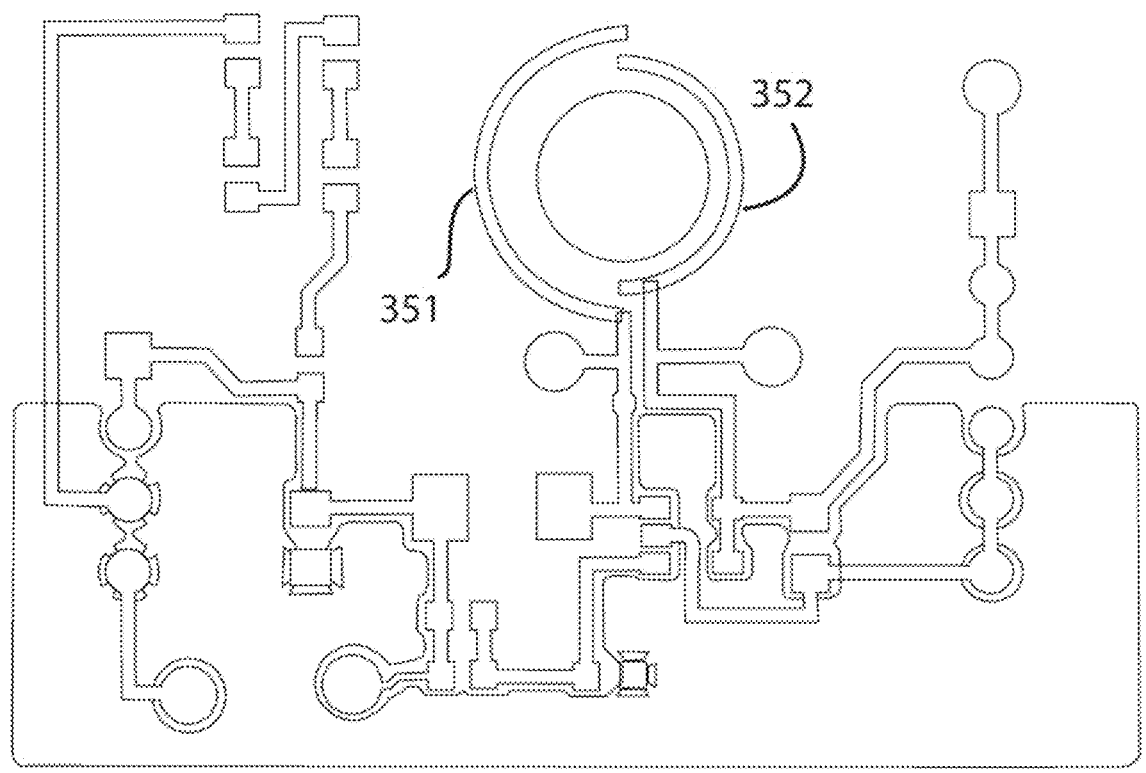
Figure 3B:
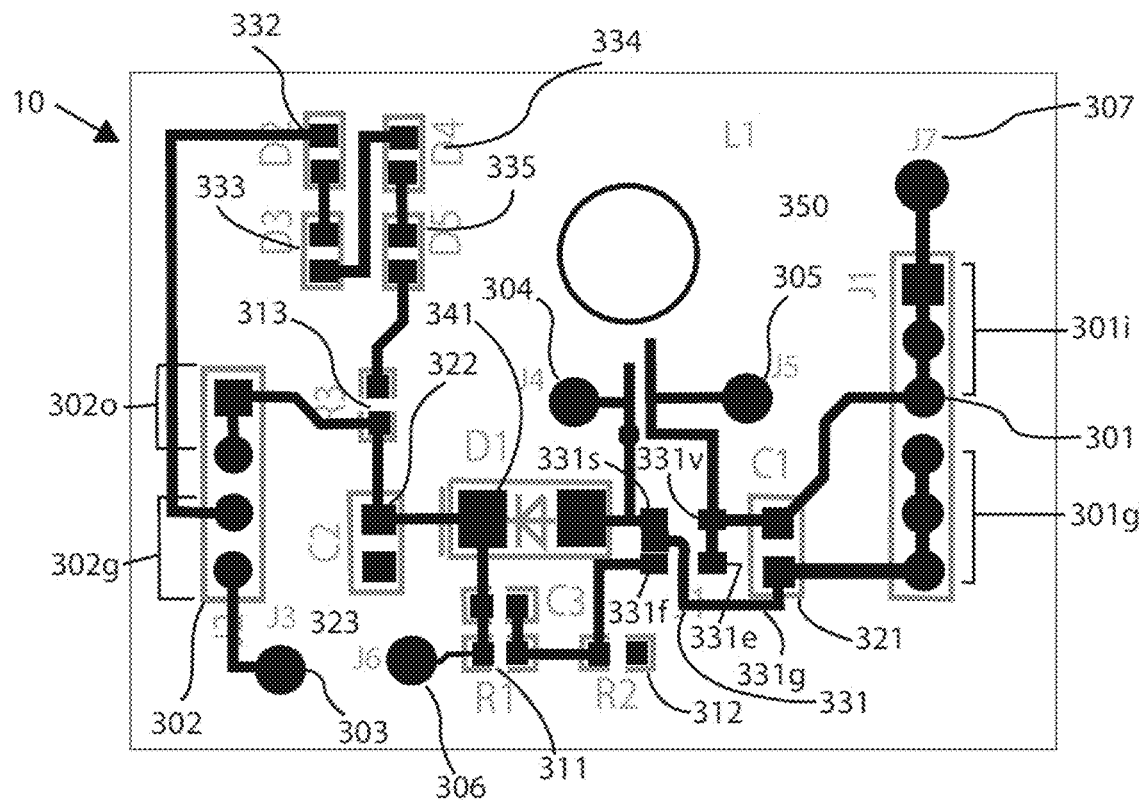
FIG. 3B is the same schematic as in 3A, showing the components of the lumped circuit model of FIG. 1.

In an exemplary implementation of the cPCBT, each of the primary winding element and each secondary winding element of the cPCB-based transformer disclosed herein, are arranged as a double helical winding, whereby the secondary helical winding element is nested concentrically inside the primary helical winding element (see e.g., FIG. 2). Furthermore, the secondary helical winding element has the same pitch as the primary helical winding element. Accordingly and in another exemplary implementation, each of the primary winding element and the secondary winding element is comprised of a plurality of sub-element arcs of predetermined radians, each sub-element arc is configured to be planar in a consecutive winding layer, and is concatenated to a subsequent sub-element arc with at least one of a blind via, and a buried via. As illustrated in FIG. 2, each turn of the primary helical winding element 105 is comprised of a semi-circular arc sub-element 105j, concatenated to another semi-circular arc sub-element 105j' via a blind via if referring to the top layer 101, or bottom layer 102, or blind vias 104i in any internal layer of the cPCB-based transformer. Likewise, each turn of the secondary helical winding element 106 is comprised of a semi-circular arc sub-element 106k, concatenated to another semi-circular arc sub-element 106k' via a blind via if referring to the top layer 101, or bottom layer 102, or blind vias 104i in any internal layer of the cPCB-based transformer.

In other examples, each sub-element arc of the primary 105j, 105' and secondary 106k, 106' winding elements can be configured to form a single turn with any number of circular sub elements, of the same or different length and provide a predetermined number of turns for a given thickness with the turn having a given radius. To provide the step/up, step-down transformation of power or data, the (single) turn ratio of the primary winding as concatenated with the sub-element arcs to the secondary winding element is between 1.1 and 40. For example, the turn ratio can be between 1.1 and 2.0, or between 1.1 and 1.5, for example, 1.25. Accordingly, and as illustrated in FIG. 2, the turn diameter of the primary helical winding can be, for example, 10 mm, while the turn diameter of the secondary helical winding element can be 8 mm in diameter.

For example, the primary and secondary helical winding elements of the cPCB-based transformer (cPCBT) disclosed herein are formed over at least 15 winding layers, and wherein at least one winding layer is an external (outer) winding layer of the cPCBT. In other words, each of the primary and/or secondary helical winding elements, regardless of how many turns are incorporated are formed over no less than 15 layers. It is noted, that the term "layer" in the context of the helical winding elements disclosed here, refers to the layer where the conductive trace forming the sub-element arc is printed. For example, using 15 sub-element arcs, each of 0.42 rad, each in its own layer, the first arc disposed on an outer layer of the cPCB-based transformer, the 15 sub-element arcs concatenated by vias, the first being a blind via and the rest (if the helix is not configured to span the thickness of the cPCB-based transformer), buried vias, will form one turn. In another example, over the same thickness, and varying the sub-element arcs' radians, it is possible to form higher number of turns having the same turn diameter and turn ratio. Moreover, using the methods implemented with the systems disclosed, it is possible to form the whole winding coil between the outer surfaces of the cPCB-based transformer. It is further noted that in applications where parasitic capacitance is an issue (e.g., in high bandwidth switching operations), it is possible to improve the performance by, for example, increasing the pitch thus the distance between layers (increasing the thickness of the dielectric laminate layer without compromising the coupling performance.

In yet another exemplary implementation, the primary helical winding element is electrically coupled to the secondary helical winding element at the basal winding layer, at the apical winding element, or from the apical layer of the primary helical winding element, to the basal layer of the secondary helical winding element, and vice versa.

The cPCB-based transformer formed using the systems and methods described herein, are sized configured and adapted to be operated at a frequency of between 100 kHz and 5 Mhz, for example, between 2 Mhz and 5 MHz; wherein said transformer is operated by a high-frequency carrier signal, modulated by a low frequency non-zero switching signal; and wherein the low frequency, non-zero switching signal is at a frequency of between about 100 kHz and about 1.0 MHz, for example, between about 350 KHz and about 1.0 MHz.

Likewise, the BTCP formed using the systems and methods described herein, are sized configured and adapted to be operated at a frequency of between 500 MHz and 80 GHz, for example, between 500 MHz and 77 GHz, wherein said BTCP is operated by a high-frequency carrier signal.

The term "forming" (and its variants "formed", etc.) refers in an exemplary implementation to pumping, injecting, pouring, releasing, displacing, spotting, circulating, or otherwise placing a fluid or material (e.g., the conducting ink) in contact with another material (e.g., the substrate, the resin or another layer) using any suitable manner known in the art.

Curing the insulating and/or dielectric layer or pattern deposited by the appropriate print head as described herein, can be achieved by, for example, heating, photopolymerizing, drying, depositing plasma, annealing, facilitating redox reaction, irradiation by ultraviolet beam or a combination comprising one or more of the foregoing. Curing does not need to be carried out with a single process and can involve several processes either simultaneously or sequentially, (e.g., drying and heating and depositing crosslinking agent with an additional print head). In an exemplary implementation, curing is done using actinic radiation such as a UV rod lamp operable at a wavelength of between about 355 nm and about 400 nm, for example, 395 nm wherein the dielectric pattern is passed below the lamp, or alternatively, the lamp is passed over the DI pattern at a predetermined height, configured to activate a photoinitiator included in the DI ink composition. Photoinitiators that can be used with the multifunctional acrylates described herein can be, for example radical photoinitiator. These radical photoinitiators can be, for example Irgacure® 500 from CIBA SPECIALTY CHEMICAL and Darocur® 1173, Irgacure® 819, Irgacure® 184, TPO-L (ethyl(2,4,6, trimethyl benzoil) phenyl phosphinate) benzophenone and acetophenone compounds and the like. For example, the radical photoinitiator can be cationic photo-initiator, such as mixed triarylsulfonium hexafluoroantimonate salts. Another example of the radical photoinitiator used in the active continuous phase described herein, can be 2-ispropylthioxanthone.

Furthermore, and in another exemplary implementation, crosslinking refers to joining moieties together by covalent bonding using a crosslinking agent, i.e., forming a linking group, or by the radical polymerization of monomers such as, but not limited to methacrylates, methacrylamides, acrylates, or acrylamides. In some exemplary implementation, the linking groups are grown to the end of the polymer arms.

Therefore, in an exemplary implementation, the vinyl constituents are monomers comonomers, and/or oligomers selected from the group comprising a multi-functional acrylate, their carbonate copolymers, their urethane copolymers, or a composition of monomers and/or oligomers comprising the foregoing. Thus, the multifunctional acrylate is 1,2-ethanediol diacrylate, 1,3-propanediol diacrylate, 1,4-butanediol diacrylate, 1,6-hexanediol diacrylate, dipropylene glycol diacrylate, neopentyl glycol diacrylate, ethoxylated neopentyl glycol diacrylate, propoxylated neopentyl glycol diacrylate, tripropylene glycol diacrylate, bisphenol-A-diglycidyl ether diacrylate, hydroxypivalic acid neopentanediol diacrylate, ethoxylated bisphenol-A-diglycidyl ether diacrylate, polyethylene glycol diacrylate, trimethylolpropane triacrylate, ethoxylated trimethylolpropane triacrylate, propoxylated trimethylolpropane triacrylate, propoxylated glycerol triacrylate, tris(2-acryloyloxyethyl) isocyanurate, pentaerythritol triacrylate, ethoxylated pentaerythritol triacrylate, pentaerythritol tetraacrylate, ethoxylated pentaerythritol tetraacrylate, ditrimethylolpropane tetraacrylate, dipentaerythritol pentaacrylate and dipentaerythritol hexaacrylate or a multifunctional acrylate composition comprising one or more of the foregoing.

Other functional heads may be located before, between or after the inkjet ink print heads used in the systems for implementing the methods described herein. These may include a source of electromagnetic radiation configured to emit electromagnetic radiation at a predetermined wavelength ($\lambda$), for example, between 190 nm and about 400 nm, e.g. 395 nm which, in an exemplary implementation, can be used to accelerate and/or modulate and/or facilitate a photopolymerizable insulating and/or dielectric. Other functional heads can be heating elements, additional printing heads with various inks (e.g., support, pre-soldering connective ink, label printing of various components for example capacitors, transistors and the like) and a combination of the foregoing.

In addition and in the context of the disclosure, the term "sintering", refers to the process of forming a trace, a filled via, a plated via, or any metallic pattern from a conductive ink (CI) comprising metal (e.g., Ag, Cu, Au,) nanoparticle by heating the CI at a temperature below its melting point. In an exemplary implementation, sintering is done using a focused IR lamp, or the like device operable to heat a predefined area.

Other similar functional steps (and therefore the support systems for affecting these steps) may be taken before or after each of the DI or metallic conducting inkjet ink print heads (e.g., for sintering the conducting layer). These steps may include (but not limited to): photobleaching (of a photoresist mask support pattern), photocuring, or exposure to any other appropriate actininc radiation source (using e.g., a UV light source); drying (e.g., using vacuum region, or heating element); (reactive) plasma deposition (e.g., using pressurized plasma gun and a plasma beam controller); cross linking such as by using cationic initiator e.g. [4-[(2-hydroxytetradecyl)-oxyl]-phenyl]-phenyliodonium hexafluoro antimonate to a flexible resin polymer solutions or flexible conductive resin solutions; prior to coating; annealing, or facilitating redox reactions and their combination regardless of the order in which these processes are utilized. In certain exemplary implementation, a laser (for example, selective laser sintering/melting, direct laser sintering/melting), or electron-beam melting can be used on the rigid resin, and/or the flexible portion.

Formulating the conducting ink composition may take into account the requirements, if any, imposed by the deposition tool (e.g., in terms of viscosity and surface tension of the composition) and the deposition surface characteristics (e.g., hydrophilic or hydrophobic, and the interfacial energy of the substrate or the support material (e.g., glass) if used), or the substrate layer on which consecutive layers are deposited. For example, the viscosity of either the conducting inkjet ink and/or the DI (measured at the printing temperature ° C.) can be, for example, not lower than about 5 cP, e.g., not lower than about 8 cP, or not lower than about 10 cP, and not higher than about 30 cP, e.g., not higher than about 20 cP, or not higher than about 15 cP. The conducting ink, can each be configured (e.g., formulated) to have a dynamic surface tension (referring to a surface tension when an ink-jet ink droplet is formed at the print-head aperture) of between about 25 mN/m and about 35 mN/m, for example between about 29 mN/m and about 31 mN/m measured by maximum bubble pressure tensiometry at a surface age of 50 ms and at 25° C. The dynamic surface tension can be formulated to provide a contact angle with the peelable substrate, the support material, the resin layer(s), or their combination, of between about 100° and about 165°.

In an exemplary implementation, the term "chuck" is intended to mean a mechanism for supporting, holding, or retaining the substrate or a workpiece. The chuck may include one or more substrates. In one exemplary implementation, the chuck may include a combination of a stage and an insert, a platform, which can be jacketed or otherwise be configured for heating and/or cooling and have another similar component, or any combination thereof.

In an exemplary implementation, the ink-jet ink compositions, systems and methods allowing for a direct, continuous or semi-continuous ink-jet printing to form/fabricate the cPCB-based Transformer and or the cPCB-based bias-T supplier and other circuits using a single inductor coil described, comprising the helical winding coil described herein, can be patterned by expelling droplets of the liquid ink-jet ink provided herein from an orifice one-at-a-time, as the print-head (or the chuck) is maneuvered, for example in two (X-Y) (it should be understood that the print head also move in the Z axis to, for example, form the blind and/or buried vias forming the helical pitch between layers) dimensions at a predetermined distance above chuck or any subsequent layer. The height of the print head can be changed with the number of layers, maintaining for example a fixed distance. Each droplet can be configured to take a predetermined trajectory to the substrate on command by, for example a pressure impulse, via a deformable piezo-crystal in an exemplary implementation, from within a well operably coupled to the orifice. The printing of the first inkjet metallic ink can be additive and can accommodate a greater number of layers. The ink-jet print heads provided used in the methods described herein can provide a minimum layer film thickness equal to or less than about 0.3 μm-10,000 μm The conveyor maneuvering among the various print heads used in the methods described and implementable in the systems described can be configured to move at a velocity of between about 5 mm/sec and about 1000 mm/sec. The velocity of the chuck e.g., can depend, for example, on: the desired throughput, the number of print heads used in the process, the number and thickness of layers of the printed circuit boards including built-in passive and embedded active components described herein printed, the curing time of the ink, the evaporation rate of the ink solvents, the distance between the print head(s) containing the first ink-jet conducting ink of the metal particles or metallic polymer paste and the second print head comprising the second, thermoset resin and board forming inkjet ink, and the like or a combination of factors comprising one or more of the foregoing.

In an exemplary implementation, the volume of each droplet of the metallic (or metallic) ink, and/or the second, resin ink, can range from 0.5 to 300 picoLiter (pL), for example 1-4 pL and depended on the strength of the driving pulse, its waveform and the properties of the ink. The waveform to expel a single droplet can be a 10V to about 70 V pulse, or about 16V to about 20V, and can the ink be expelled at frequencies between about 2 kHz and about 500 kHz. It is noted that using the fabrication systems provided herein, control using the waveform enables control over each nozzle in the print-heads' nozzle array to achieve drop-on-demand (DOD), which is beneficial for the necessary accuracy required for the helical winding(s)

The 3D visualization file representing the printed circuit boards including built-in passive and embedded active components used for the fabrication of the cPCBT and or the cPCB-based circuits containing a single inductor coil (cPCBI), can be: an an ODB, an ODB++, an.asm, an STL, an IGES, a DXF, a DMIS, NC, a STEP, a Catia, a Solid-Works, a Autocad, a ProE, a 3D Studio, a Gerber, an EXCELLON file, a Rhino, a Altium, an Orcad, an or a file comprising one or more of the foregoing; and wherein file that represents at least one, substantially 2D layer (and uploaded to the library) can be, for example, a JPEG, a GIF, a TIFF, a BMP, a PDF file, or a combination comprising one or more of the foregoing.

The computer controlling the printing process described herein can comprise: a computer readable storage medium having computer readable program code embodied therewith, the computer readable program code when executed by a processor in a digital computing device causes a three-dimensional inkjet printing unit to perform the steps of: pre-process Computer-Aided Design/Computer-Aided Manufacturing (CAD/CAM) generated information (e.g., the 3D visualization file), associated with the cPCBT and/or cPCBI and/or the non-concentric tear-drop shaped helical windings described, having in an exemplary implementation a helical coil (wnhether concentric or eccentric) comprised of, in the cPCBT; a secondary helical winding element nested concentrically in the primary helical winding element, or a plurality of planar sub-element arcs of predetermined curvature, to create a (master) library of a plurality of 2D files (in other words, the file that represents at least one, substantially 2D layer for printing the PCB); direct a stream of droplets of a metallic material from a second inkjet print head of the three-dimensional inkjet printing unit at a surface of a substrate; direct a stream of droplets of a DI resin material from a first inkjet print head at the surface of the substrate; alternatively or additionally direct a stream of droplets material from another inkjet print head (e.g., the support ink); move the substrate relative to the inkjet heads in an X-Y plane of the substrate, wherein the step of moving the substrate relative to the inkjet heads in the X-Y plane of the substrate, for each of a plurality of layers (and/or the patterns of conductive or DI inkjet inks within each layer), is performed in a layer-by-layer fabrication.

In an exemplary implementation, the CPM is operable to, for each file representing the substantially 2D layer of dielectric ink pattern, generate a sub (slave) library of conductive ink pattern files, each conductive ink pattern file representing a substantially 2D layer for printing. Each of the sub library files of conductive patterns, can further comprise a metafile with at least one of: an order of printing, an identifier of the (master) library file of substantially 2D layer of dielectric ink pattern it is associated with, and instructions on at least one of: speed of printing, and printing order. It is noted, that the generated sub-library can comprise the number of files configured, once the final substantially 2D conductive ink pattern in the sub-library is sintered, to have the same thickness (or height) is the corresponding cured dielectric ink layer. For example, the sub-library can comprise between about 10 and about 55 files, each representing a substantial 2D layer of conductive ink for printing. In addition, the conductive ink pattern in each file can be identical, or at least one file can have a different pattern than another file in the sub library. Moreover, the thickness formed upon fabrication and sintering of the final substantially 2D conductive ink pattern, can be higher or lower than the surface of the cured substantially 2D layer of dielectric ink pattern printed. For example, in forming through-hole vias, unfilled vias, it may be desirable to raise the upper surface of the through-hole, unfilled via above the dielectric layer thickness, to ensure electric contact between layers. Similarly, when forming wells for integrated circuit legs (e.g., J-legs), it may be advantageous to lower the conductive ink pattern below the surface of the dielectric ink layer.

In addition, the computer program, can comprise program code means for carrying out the steps of the methods described herein, as well as a computer program product comprising program code means stored on a medium that can be read by a computer. Memory device(s) as used in the methods described herein can be any of various types of non-volatile memory devices or storage devices (in other words, memory devices that do not lose the information thereon in the absence of power). The term "memory device" is intended to encompass an installation medium, e.g., a CD-ROM, floppy disks, or tape device or a non-volatile memory such as a magnetic media, e.g., a hard drive, optical storage, or ROM, EPROM, FLASH, etc.

The memory device may comprise other types of memory as well, or combinations thereof. In addition, the memory medium may be located in a first computer in which the programs are executed (e.g., the 3D inkjet printer provided), and/or may be located in a second different computer which connects to the first computer over a network, such as the Internet. In the latter instance, the second computer may further provide program instructions to the first computer for execution. The term "memory device" can also include two or more memory devices which may reside in different locations, e.g., in different computers that are connected over a network. Accordingly, for example, the bitmap library can reside on a memory device that is remote from the CAM module coupled to the 3D inkjet printer provided, and be accessible by the 3D inkjet printer provided (for example, by a wide area network).

Unless specifically stated otherwise, as apparent from the following discussions, it is appreciated that throughout the specification discussions utilizing terms such as "processing," "loading," "in communication," "detecting," "calculating," "determining", "analyzing," or the like, refer to the action and/or processes of a computer or computing system, or similar electronic computing device, that manipulate and/or transform data represented as physical, such as a transistor architecture into other data similarly represented as physical structural (in other words, resin or metal/metallic) layers.

Furthermore, in relation to systems, methods, AME circuits and programs, the term "operable" means the system and/or the device and/or the program, or a certain element or step is/are fully functional sized, adapted and calibrated, comprising necessary elements for, and meeting applicable operability requirements to perform a recited function when activated, coupled, implemented, effected, realized; or when an executable program is executed by at least one processor associated with the system and/or the device. In relation to systems and AME circuits (e.g., the cPCBT/cPCBI/BTCB), the term "operable" means the system and/or the circuit is fully functional and calibrated, comprises logic for, and meets applicable operability requirements to perform a recited function when a set of executable instructions in a processor-readable media, stored on a memory device are executed by at least one processor Furthermore, as used herein, the term "2D file library" refers to a given set of files that when assembled and printed together define a single cPCBT/cPCBI/BTCB, or a plurality of cPCBTs/cPCBIs/BTCBs used for a given purpose. Furthermore, the term "2D file library" can also be used to refer to a set of 2D files or any other raster graphic file format (the representation of images as a collection of pixels, generally in the form of a rectangular grid, e.g., BMP, PNG, TIFF, GIF), capable of being indexed, searched, and reassembled to provide the structural layers of a given PCB, whether the search is for the cPCBT/cPCBI/BTCB as a whole, or a given specific layer within the PCB.

The Computer-Aided Design/Computer-Aided Manufacturing (CAD/CAM) generated information associated with the cPCBT/cPCBI/BTCB having integrally printed helical winding coil(s) components described herein to be fabricated, whether continuous or concatenated, which is used in the methods, programs, libraries and sub-libraries, can be based on converted CAD/CAM data packages can be, for example, IGES, DXF, DWG, DMIS, NC files, GERBER® files, EXCELLON®, STL, EPRT files, an ODB, an ODB++, an.asm, an STL, an IGES, a STEP, a Catia, a SolidWorks, a Autocad, a ProE, a 3D Studio, a Gerber, a Rhino a Altium, an Orcad, an Eagle file or a package comprising one or more of the foregoing. Additionally, attributes attached to the graphics objects transfer the meta-information needed for fabrication and can precisely define the PCBs. Accordingly and in an exemplary implementation, using pre-processing algorithm, GERBER®, EXCELLON®, DWG, DXF, STL, EPRT ASM, and the like as described herein, are converted to 2D files. Moreover, the contacts fabricated using the methods described herein can be coupled to traces at any layer, or combination of layers.

A more complete understanding of the components, processes, assemblies, and devices disclosed herein can be obtained by reference to the accompanying drawings. These figures (also referred to herein as "FIG.s") are merely schematic representations (e.g., illustrations) based on convenience and the ease of demonstrating the present disclosure, and are, therefore, not intended to indicate relative size and dimensions of the devices or components thereof and/or to define or limit the scope of the exemplary implementations. Although specific terms are used in the following description for the sake of clarity, these terms are intended to refer only to the particular structure of the implementations selected for illustration in the drawings, and are not intended to define or limit the scope of the disclosure. In the drawings and the following description below, it is to be understood that like numeric designations refer to components of like function and/or composition and/or structure.

EXAMPLE 1

Figure 1:
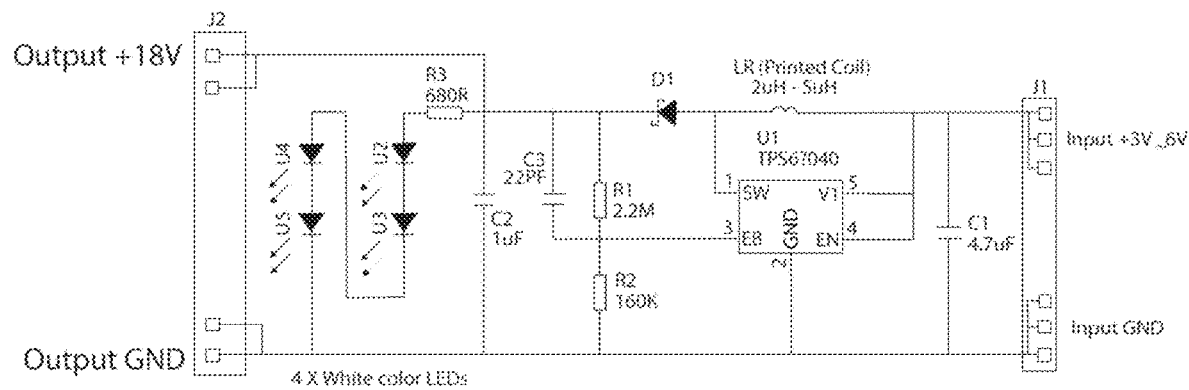
FIG. 1, is an equivalent lumped circuit model of a cPCB-based transformer shown in FIG. 3.

Helical Winding Induction Coil of Semi-Circular Sub-Element Arcs for LCD Bias Supplier Turning to FIGS. 1-5B illustrating in FIG. 1, a schematic of the equivalent lumped circuit model of the high frequency cPCBI fabricated using the methods implemented in the systems described herein. The cPCBI can be used for small to medium LCD bias supply and white LED backlight supplies. As illustrated in FIG. 3B, the cPCBI comprises contact junction ($J_1$, FIG. 1) 301, comprised of input ports 301$_I$ (for between about 3 and 6 volts) and input Ground 301$_G$ separated by primary capacitor C1, exhibiting primary capacitance of 4.7 micro Farad (μF) leading to a high frequency step-up switching regulator (e.g., switch boost converter), showing feedback pin 331$_F$ (FB, FIG. 1), switch pin 331$_S$ (SW, FIG. 1) input voltage pin 331$_V$ (VI, FIG. 1), and enable pin 331E (EN, FIG. 1), connected to single, helical winding coil 350. The duty cycle will be controlled by an integrated circuit (IC) coupled, with the minimum ON period being just above of 0% and maximum of about 50%. Likewise, the IC will control the switching operation frequency to be between about 100 KHz and about 1.0 MHz. When coil current SW is at the OFF position, the current will flow through the coil to diode 341 (D1 FIG. 1), whereas when coil current switch SW is in the ON position, the current will flow through the coil to IC 331 (U1, FIG. 1).

As illustrated in FIG. 2, showing a coil configuration for a transformer, with two insulated winding elements comprised of primary helical winding element 105 having 20 semi-circular sub element arcs 105*j*, and 105*j'* forming a single turn of the primary helical winding element 105, semi-circular sub element arcs 105*j*, and 105*j'* are each disposed in a different (winding layer), concatenated by a blind via 104*i* from top layer 101, whereby subsequent layer are concatenated with buried vias 104*i'*. As illustrated, every two sub-element arcs form a single turn having a 10 mm internal diameter (ID). The pitch was set to be 35 µm leading to an overall winding thickness of all layers being 1.4 mm (20 layers×70 µ/turn). Also shown is secondary helical winding element 106, having 20 semi-circular sub element arcs 106*k*, and 106*k'* forming a single turn of the secondary helical winding element 106, semi-circular sub element arcs 106*k*, and 106*k'* are each disposed in a different layer, concatenated by a blind via 104*i* from top layer 101, whereby subsequent layer are concatenated with buried vias 104*i'*, every two sub-element arcs forming a single turn having a 8 mm internal diameter (ID).

As illustrated in FIG. 2, and to ensure better coupling performance, the semi-circular primary sub-element arc 105*j* is configured such that the arc's apogee is at a maximum distance from the secondary sub-element arc's 106*k*'s apogee on the same layer. Furthermore and as indicated, primary helical winding element 105 and secondary helical winding element 106 are electrically coupled at basal layer 102 (see e.g, FIG. 2). The single induction coil is configured to yield between 2.0 µH and about 5.0 µH, for example, 3.0 µH, however by increasing the number of turns and the thickness of the cPCBI, 20 µH are also possible.

Turning back to FIGS. 1, 3B-4B, resistors 311, 312 (R1, R2, FIG. 1) were printed and configured to provide resistance of 2.2 megaohm and 160 kiloohm respectively. Furthermore, low ESR input capacitor 321 (C1, FIG. 1), output capacitor 322 (C2, FIG. 1) and feedforward capacitor 323 (C3, FIG. 1), needed for example for operation under lower switching frequency of the converter. Also shown is diode 341, used to achieve high efficiency of the LCD bias supplier. In addition 4 LED lights 332-335 were also configured.

Using the methods and systems, all the infrastructure including the helical inductor coil was printed. In certain exemplary implementation, the input capacitor 321, and/or output capacitor 322, can also be printed integrally with the single helical induction coil, thus reducing production time and development time. Trace width (thus the ratio between internal coil diameter and outer coil diameter (OD/ID), pitch and turn of the helices (spirals) of the induction/transformer coil(s) (see e.g., FIGS. 5A, 5B), together with the nominal load current, input and output voltage of the LCD boost supplier in the case of the cPCBI, can also be changed to achieve better performance of the switching frequency of the converter.

Turning now to FIG. 6A-9B, illustrating in an exemplary implementation a BTCB formed using the methods described. As illustrated, provided is the bias-T circuit board (BTCB) 60 having a leg and a cross-bar. BTCB 60 comprising: input port 601 disposed at first lateral end 6021 of the cross bar; signal transmission line 602 disposed along cross-bar; at least one capacitor 603 interposed between input port 601 and first lateral end 6021 of transmission line 602; output port 604 disposed at second lateral end 6022 of cross bar; and eccentric conical winding element 620 having bias feeding end 622, and termination end 621 coupled to signal transmission line 602, wherein eccentric (interchangeable with non-concentric) conical winding element 620 comprises plurality of non-concentric tear-drop shaped (see e.g., FIGS. 7B, 7C) helical windings of increasing turn ratio, or decreasing turn ratio, from bias feeding end 622 to termination end 621.

Figure 7A:
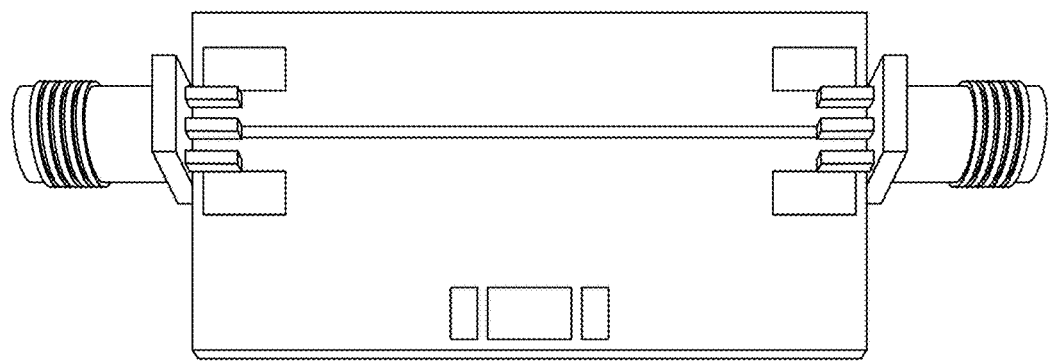
FIG. 7A, is a reference BTCB, with FIG. 7B being BTCB having first exemplary implementation of the eccentric conical tear-shaped winding element printed using the methods disclosed, and FIG. 7C being BTCB having second exemplary implementation of the eccentric conical tear-shaped winding element printed using the methods disclosed.
Figure 7C:
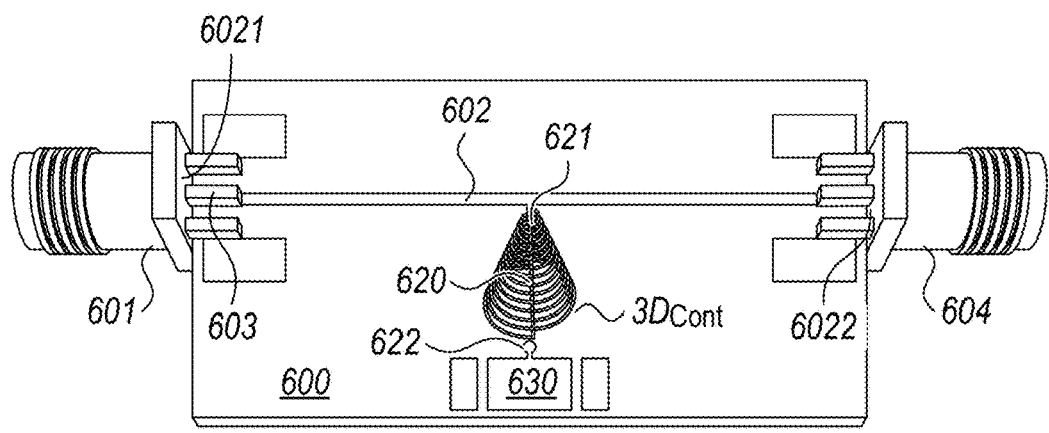
Figure 7C:
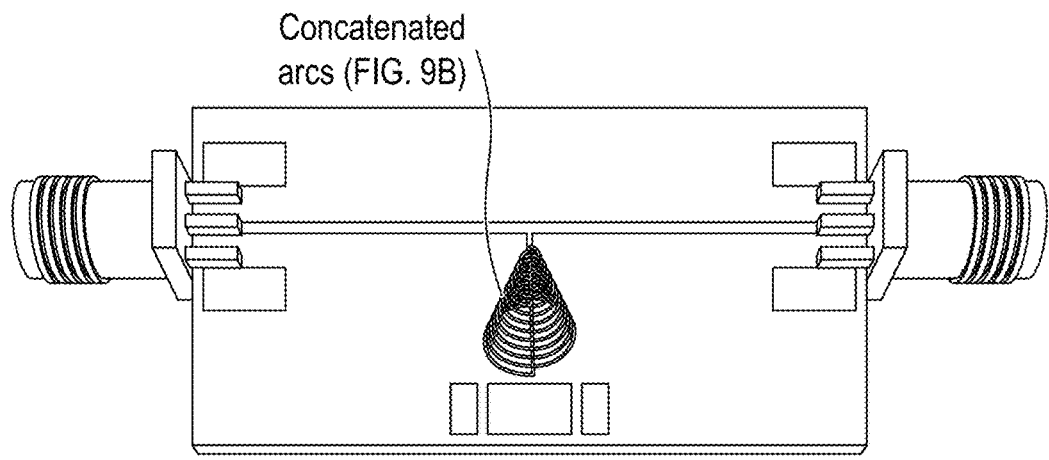

As illustrated in FIGS. 6B, 7C, and 9B, each of the plurality of non-concentric tear-drop shaped helical windings is comprised of a plurality of planar sub-element arcs 6200*i*, 6201*i* of predetermined curvature, each $i^{th}$ sub-element arc 6200*i*, 6201*i* is concatenated to a subsequent $i^{th}$ sub-element arc 6200*i*, 6201*i* with at least one of: a blind via, and a buried via 6202*j*. Alternatively, each of the plurality of non-concentric tear-drop shaped helical winding lobes 6202*p* wind continuously at a predetermined pitch of between about 20 µm and about 1000 µm. It is noted that lobes forming the continuous (in contrast with the via-concatenated windings) non-concentric tear-drop shaped helical winding lobes 6202*p* do not necessarily need to have self-similarity (in other words, do not necessarily define a fractal dimension), however it is assumed that the oblique cone formed by the non-concentric tear-drop shaped helical winding lobes 6202*p* do have a constant ratio between adjacent semi-circular lobe portions.

Figure 8A:
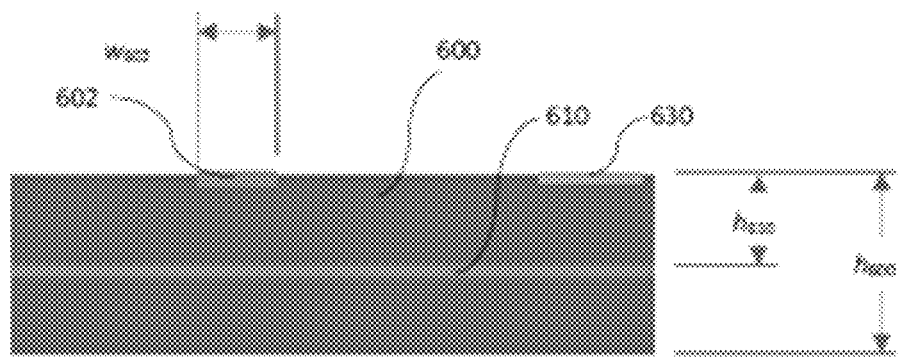
FIG. 8A illustrating a schematic side view of the structure of the reference BTCB in FIG. 7A, with FIG. 8B, illustrating a schematic side view of the structure of the BTCB in FIG. 7B and FIG. 7C.
Figure 8B:
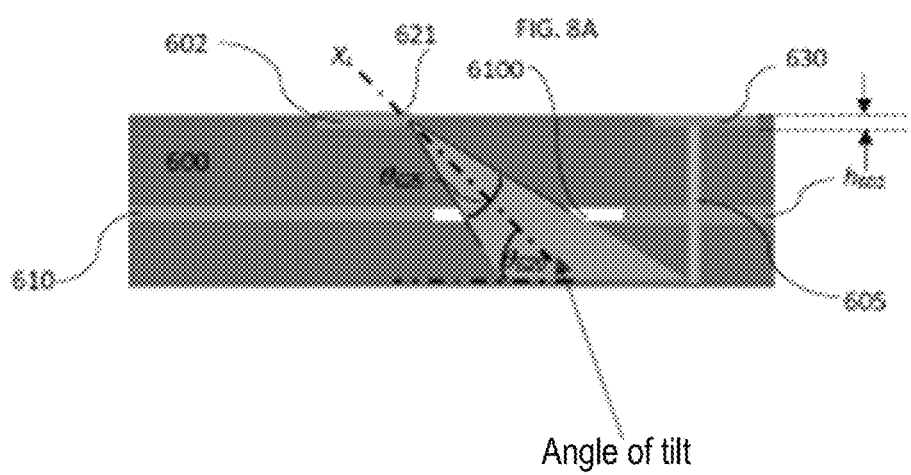

Accordingly, and as illustrated in FIG. 8B, the eccentric conical winding element 620 formed, or used in the BTCB disclosed form an oblique tear-shaped cone, whereby the longitudinal axis XL, defined by the vertex angle $\theta_{625}$ bisecter, and the cone base plane form an acute angle $\theta_{620}$. In certain implementations, the choice of the vertex angle $\theta_{625}$, and the acute angle $\theta_{620}$, the number of windings, the pitch, and the turn ratio are used to tune the high frequency signal received (input) from input port 601.

EXAMPLE I

Bias-T Circuit Boards Comprising Eccentric (Non-Concentric) Conical Tear-Shaped Winding Element Turning now to FIG. 7A-12C, illustrating an example of BTCB formed using the methods disclosed, implemented with the systems disclosed. It is noted, that the requirement for the BTCB, to be used at high frequencies (e.g., over 500 MHz), in the BTCB the self-resonance frequency should be higher than maximum data transmission frequency. Furthermore, in order to have that high self-resonance frequency, the parallel capacitance should be as low as possible, and the coil DCR should be low enough for feeding DC current. It is further noted, that using the eccentric conical tear-shaped winding element 620 disclosed, the capacitance between the windings can be reduced.

As illustrated, FIG. 7A, shows a Y-Z cross section of reference BTCB, with FIG. 7B showing a Y-Z cross section of BTCB having continuous eccentric conical tear-shaped winding element (see e.g., FIG. 9A), and FIG. 7C showing a Y-Z cross section of BTCB with via-concatenated sub-arcs eccentric conical tear-shaped winding element (see e.g., FIG. 6B, 9B), both printed using the methods disclosed. As further illustrated in FIG. 8A, Reference BTCB is comprised of bias supplier 630, signal transmission line 602 and ground layer 610. As illustrated in FIG. 8B, the BTCB having the eccentric conical tear-shaped winding element 620 are formed with bias feeding end 621 operably coupled to bias supplier 630, operably coupled to conductor 605 at basal end 6052 (see e.g., FIG. 6B, 9A) with apical end 6051, operably coupled to bias feeder 630 and termination end 622, operably coupled to signal transmission line 602. Also shown in FIG. 8*b*, is opening 6100 defined in ground plane 610, sized to allow the windings to pass through ground plane 610, while still maintaining enough plane beneath signal transmission line 602. As illustrated in FIG. 8A, in the Z direction (up/down), the thickness of the BTCBs ($h_{600}$) was about 1.2 mm, the distance between ground layer 610 and the transmission line 602 ($h_{610}$), was about 0.4 mm, the width of both the bias supplier pad, and the signal transmission line ($w_{630}$), was about 1.0 mm, and the thickness of the traces (e.g., transmission line 602) ($h_{602}$) was about 35 µm.

Measurements

Figure 9B:
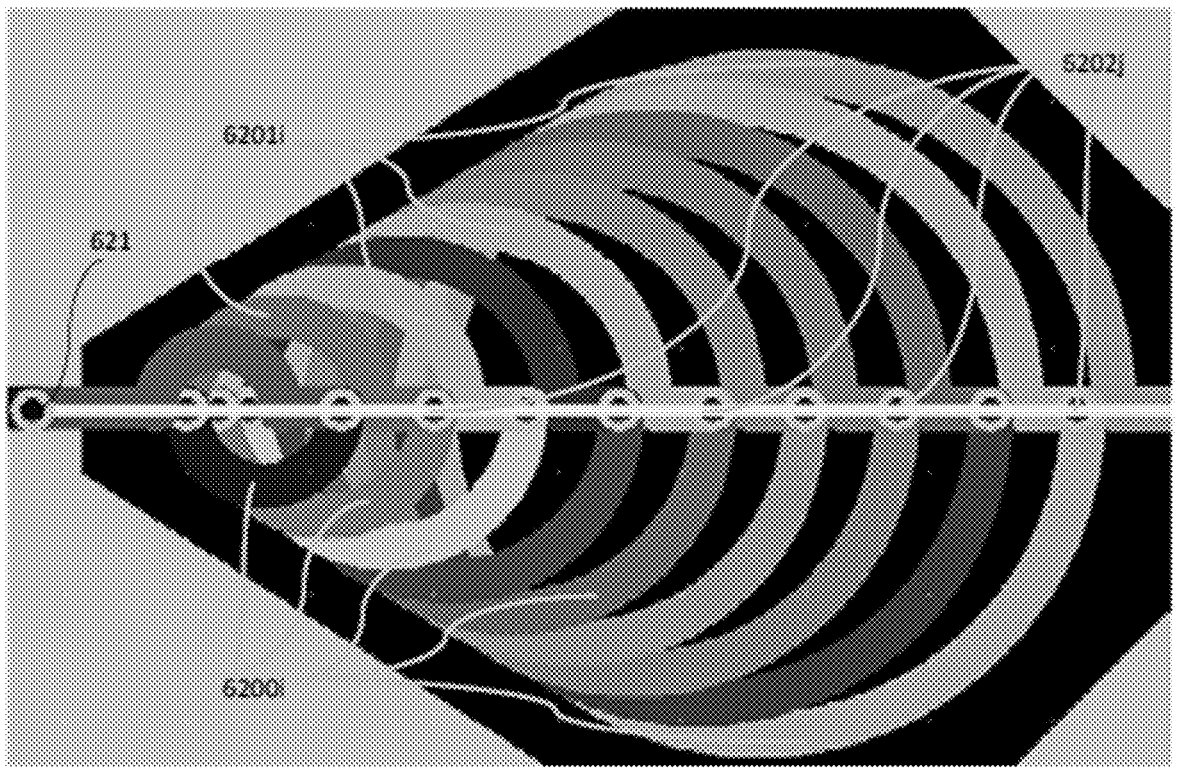

The continuous eccentric conical tear-shaped winding element illustrated in FIG. 9A, and used in BTCB shown in FIG. 7B had measured inductance value of about 440 nano Henry (nH), with measured Direct Current rating (DCR) of 900 milliohm (mΩ) at the measurement frequency of 300 KHz, whereby, each $p^{th}$ lobe 6202*p* had a width of 210 µm, with a thickness of 60 µm while the via-concatenated eccentric conical tear-shaped winding element illustrated in FIG. 9A, and used in BTCB shown in FIG. 7B had measured inductance value of about 350 nH, with measured DCR of 940 mΩ at the measurement frequency of 300 KHz, whereby, each $i^{th}$ lobe comprised of planar sub-element arcs 6200*i*, and 6201*i* concatenated with vias 6203*j*, had a width of 360 µm, with a thickness of 35 µm with both having a total of 10 full turns.

FIG. 10A, shows an equivalent lumped circuit model used for simulation of the eccentric conical tear-shaped winding element for measuring coil DCR at predetermined frequencies, with FIG. 10B, illustrating $S_{2,1}$ of the eccentric conical tear-shaped winding element at frequency of between 500 MHz, and 70 GHz. As illustrated, in FIG. 10B, the continuous eccentric conical tear-shaped winding element 620 shows a transmission bandwidth of between about 500 MHz. and about 77 GHz, with inductance of 220 nH, and capacitance $2.0 \times 10^{-5}$ picofarad (pF), while the via-concatenated eccentric conical tear-shaped winding element 620 (see e.g., FIG. 11B) a transmission bandwidth of between about 500 MHz. and about 30 GHz, with inductance of 220 nH, and capacitance $1.0 \times 10^{-4}$ pF.

The term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives.

All ranges disclosed herein are inclusive of the endpoints, and the endpoints are independently combinable with each other. "Combination" is inclusive of blends, mixtures, alloys, reaction products, and the like. The terms "a", "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the print head(s) includes one or more print head). Reference throughout the specification to "one exemplary implementation", "another exemplary implementation", "an exemplary implementation", and so forth, when present, means that a particular element (e.g., feature, structure, and/or characteristic) described in connection with the exemplary implementation is included in at least one exemplary implementation described herein, and may or may not be present in other implementations. In addition, it is to be understood that the described elements may be combined in any suitable manner in the various implementations. Furthermore, the terms "first," "second," and the like, herein do not denote any order, quantity, or importance, but rather are used to denote one element from another.

Likewise, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

Although the foregoing disclosure for using additive manufacturing to fabricate cPCBT and/or cPCBI, using inkjet printing based on converted 3D visualization CAD/CAM data packages has been described in terms of some implementations, other implementations will be apparent to those of ordinary skill in the art from the disclosure herein. Moreover, the described implementations have been presented by way of example only, and are not intended to limit the scope of the inventions. Indeed, the novel methods, programs, libraries and systems described herein may be embodied in a variety of other forms without departing from the spirit thereof. Accordingly, other combinations, omissions, substitutions and modifications will be apparent to the skilled artisan in view of the disclosure herein.

What is claimed:

1. A printed circuit bias-T circuit board (BTCB) comprising:
   a signal transmission line;
   an input port disposed at a first lateral end of the signal transmission line;
   at least one capacitor interposed between the input port and the transmission line;
   an output port disposed at a second lateral end of the signal transmission line; and
   an eccentric conical winding element having a bias feeding end and a termination end,
   wherein the eccentric conical winding element comprises a plurality of non-concentric tear-drop shaped helical windings of increasing turn ratio, or decreasing turn ratio, from the bias feeding end to the termination end, and
   wherein the termination end is operably coupled to the signal transmission line.

2. The BTCB of claim 1, wherein each of the plurality of non-concentric tear-drop shaped helical windings comprises a plurality of planar sub-element arcs of predetermined curvature, wherein each sub-element arc is concatenated to a subsequent sub-element arc with at least one of a blind via, and a buried via.

3. The BTCB of claim 1, wherein each of the plurality of non-concentric tear-drop shaped helical windings wind continuously at a predetermined pitch of between about 20 µm and about 1000 µm.

4. The BTCB of claim 1, wherein the eccentric conical winding element forms an oblique tear-shaped cone.

5. The BTCB of claim 1, wherein the termination end is operably coupled to the signal transmission line through a vertical inductor.

6. The BTCB of claim 1, wherein the eccentric conical winding element is sized and configured to operate at an input frequency of between 500 MHz and 70 GHz.

\* \* \* \* \*